(12) United States Patent
Yu et al.

(10) Patent No.: US 10,658,381 B1
(45) Date of Patent: May 19, 2020

(54) MEMORY DIE HAVING WAFER WARPAGE REDUCTION THROUGH STRESS BALANCING EMPLOYING ROTATED THREE-DIMENSIONAL MEMORY ARRAYS AND METHOD OF MAKING THE SAME

(71) Applicant: SANDISK TECHNOLOGIES LLC, Addison, TX (US)

(72) Inventors: Jixin Yu, Milpitas, CA (US); Fumiaki Toyama, Cupertino, CA (US); Masaaki Higashitani, Cupertino, CA (US); Tong Zhang, Palo Alto, CA (US); Chun Ge, San Jose, CA (US); Xin Yuan Li, Yokkaichi (JP); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/367,455

(22) Filed: Mar. 28, 2019

(51) Int. Cl.
*H01L 27/11565* (2017.01)
*H01L 27/11582* (2017.01)
(Continued)

(52) U.S. Cl.
CPC ........ *H01L 27/11582* (2013.01); *G11C 5/063* (2013.01); *H01L 27/1157* (2013.01);
(Continued)

(58) Field of Classification Search
CPC ................................................ H01L 27/11565
See application file for complete search history.

(56) References Cited

U.S. PATENT DOCUMENTS

| 5,915,167 | A  | 6/1999 | Leedy |
| 9,230,984 | B1 | 1/2016 | Takeguchi |

(Continued)

FOREIGN PATENT DOCUMENTS

JP         06082819 A    *    3/1994

OTHER PUBLICATIONS

Machine translation of JP-06082819-A (Year: 1994).*
(Continued)

*Primary Examiner* — Peniel M Gumedzoe
*Assistant Examiner* — Christopher A Johnson
(74) *Attorney, Agent, or Firm* — The Marbury Law Group PLLC

(57) ABSTRACT

Memory dies on a wafer may include multiple memory blocks including bit lines extending along different directions. A memory die may include a first-type plane including first memory blocks and a second-type plane including second memory blocks. In this case, memory blocks having different bit line directions may be formed within a same memory die. An exposure field may include multiple types of memory dies that are oriented in different orientations. The bit line directions may be oriented differently in the multiple types of memory dies. Each lithographic exposure process may include a first step in which lithographic patterns in first exposure fields are oriented in one direction, and a second step in which lithographic patterns in second exposure fields are oriented in another direction. The different orientations of bit lines and word lines may change local directions of stress to reduce wafer distortion.

5 Claims, 33 Drawing Sheets

(51) Int. Cl.
*G11C 5/06* (2006.01)
*H01L 27/1157* (2017.01)
*H01L 27/11556* (2017.01)
*H01L 27/11519* (2017.01)
*H01L 27/11524* (2017.01)
*H01L 27/11529* (2017.01)
*H01L 27/11558* (2017.01)
*H01L 27/11573* (2017.01)

(52) U.S. Cl.
CPC .. *H01L 27/11519* (2013.01); *H01L 27/11524* (2013.01); *H01L 27/11529* (2013.01); *H01L 27/11556* (2013.01); *H01L 27/11558* (2013.01); *H01L 27/11565* (2013.01); *H01L 27/11573* (2013.01)

(56) References Cited

U.S. PATENT DOCUMENTS

| | | | |
|---|---|---|---|
| 9,343,358 | B1 | 5/2016 | Xu |
| 9,419,135 | B2 | 8/2016 | Baenninger et al. |
| 9,437,543 | B2 | 9/2016 | Nakada et al. |
| 9,443,861 | B1 | 9/2016 | Pachamuthu et al. |
| 9,455,267 | B2 | 9/2016 | Zhang et al. |
| 9,524,981 | B2 | 12/2016 | Pachamuthu et al. |
| 9,698,223 | B2 | 7/2017 | Sharangpani et al. |
| 9,799,671 | B2 | 10/2017 | Pachamuthu et al. |
| 9,887,207 | B2 | 2/2018 | Zhang et al. |
| 9,917,093 | B2 | 3/2018 | Chu et al. |
| 10,103,161 | B2 | 10/2018 | Ito et al. |
| 10,242,994 | B2 | 3/2019 | Inomata et al. |
| 2016/0049421 | A1 | 2/2016 | Zhang et al. |
| 2016/0086969 | A1 | 3/2016 | Zhang et al. |
| 2016/0141419 | A1 | 5/2016 | Baenninger et al. |
| 2016/0149002 | A1 | 5/2016 | Sharangpani et al. |
| 2016/0204117 | A1 | 7/2016 | Liu et al. |
| 2016/0218059 | A1 | 7/2016 | Nakada et al. |
| 2016/0300848 | A1 | 10/2016 | Pachamuthu et al. |
| 2016/0329343 | A1 | 11/2016 | Pachamuthu et al. |
| 2017/0025421 | A1 | 1/2017 | Sakakibara et al. |
| 2017/0373078 | A1 | 12/2017 | Chu et al. |
| 2017/0373087 | A1 | 12/2017 | Ito et al. |
| 2018/0006049 | A1 | 1/2018 | Inomata et al. |
| 2018/0011398 | A1 | 1/2018 | Tel et al. |
| 2018/0366487 | A1 | 12/2018 | Okizumi et al. |
| 2018/0374865 | A1 | 12/2018 | Shimabukuro et al. |

OTHER PUBLICATIONS

USPTO Office Communication, Non-Final Office Action for U.S. Appl. No. 16/516,726, dated Jan. 6, 2020, 17 pages.

Endoh, T. et al., "Novel Ultra High Density Flash Memory with a Stacked-Surrounding Gate Transistor (S-GT) Structured Cell," IEDM Proc., pp. 33-36, (2001).

Notification of Transmittal of the International Search Report and Written Opinion of the International Search Authority for International Patent Application No. PCT/US2019/063597, dated Apr. 5, 2020, 13 pages.

* cited by examiner

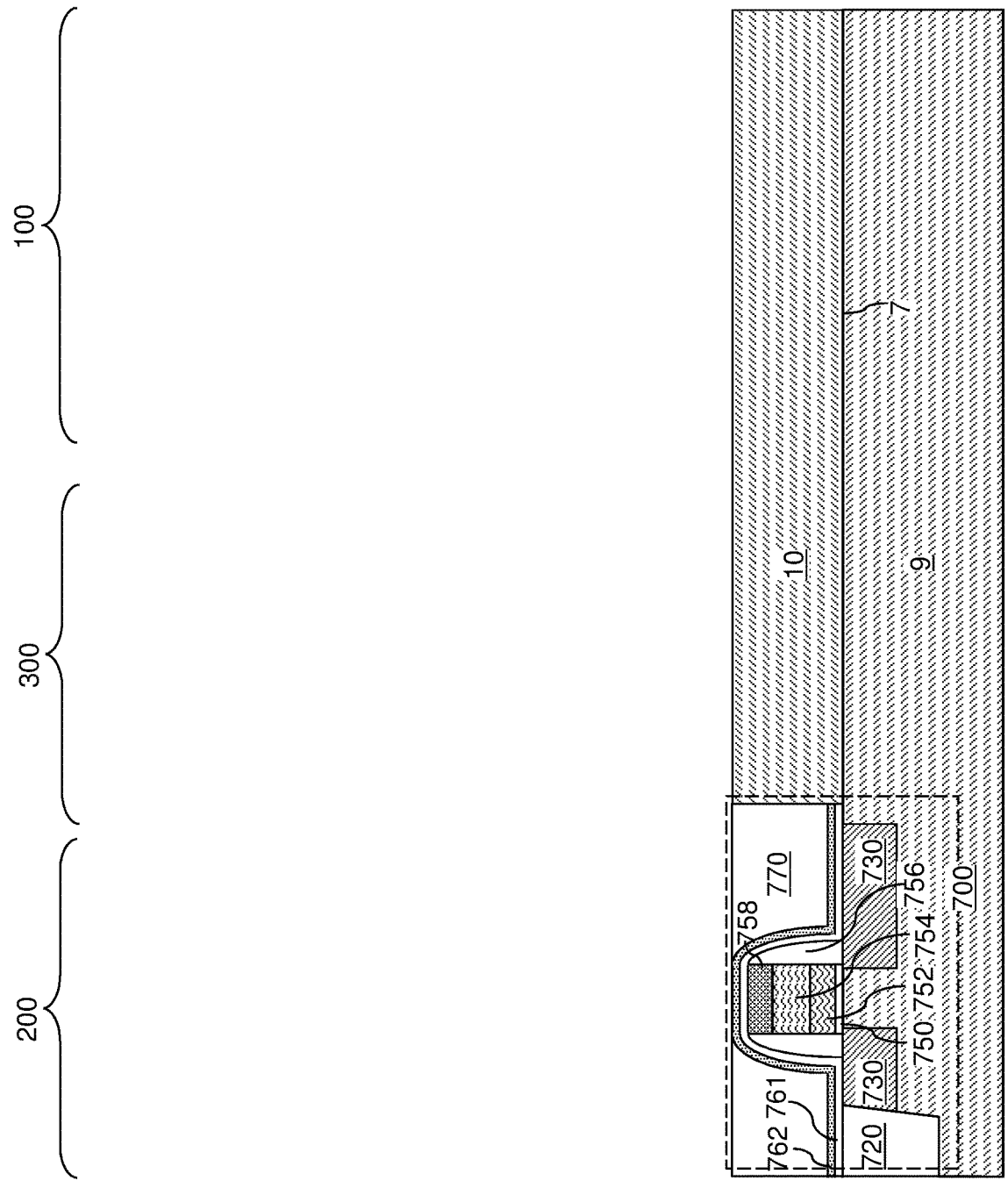

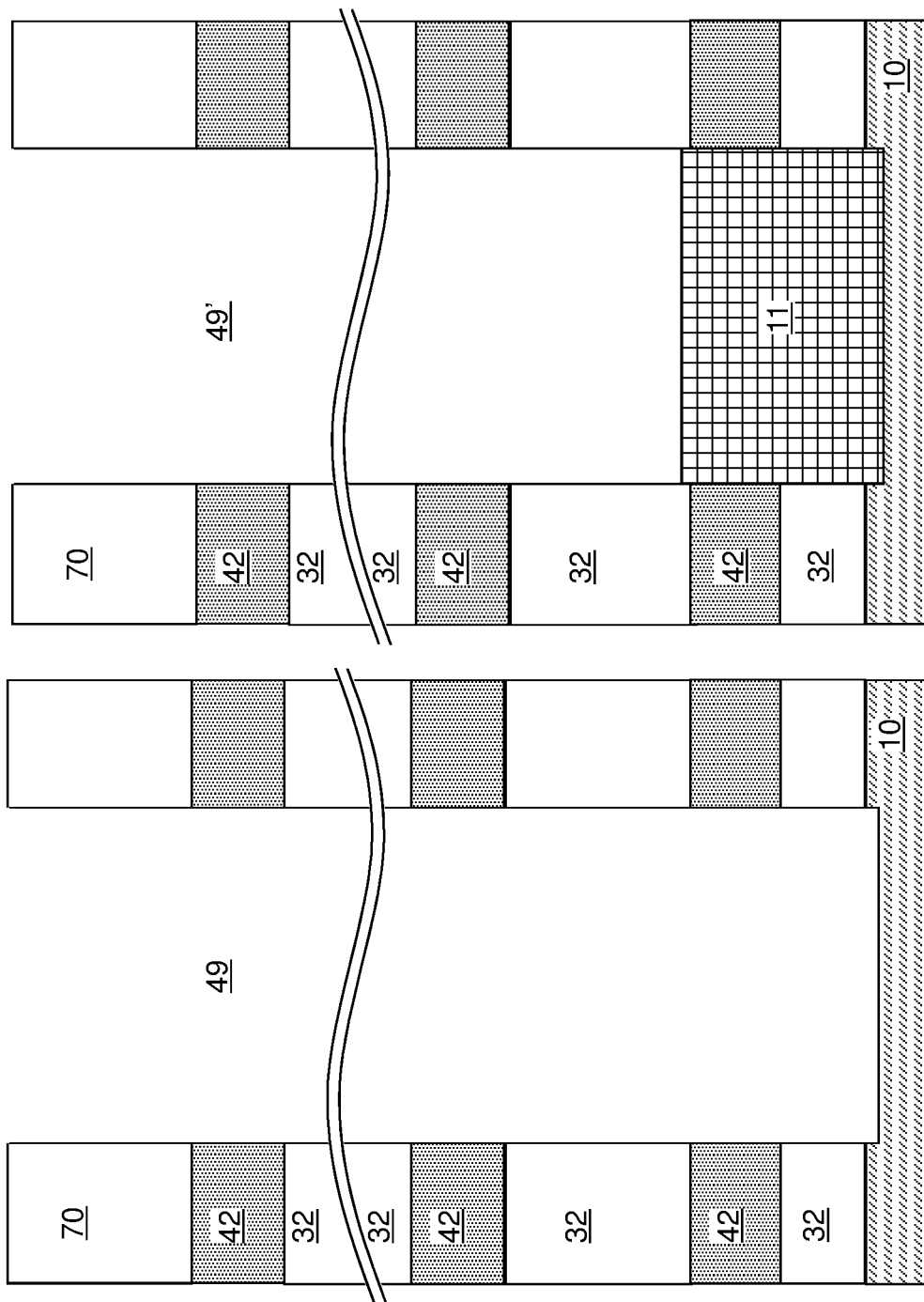

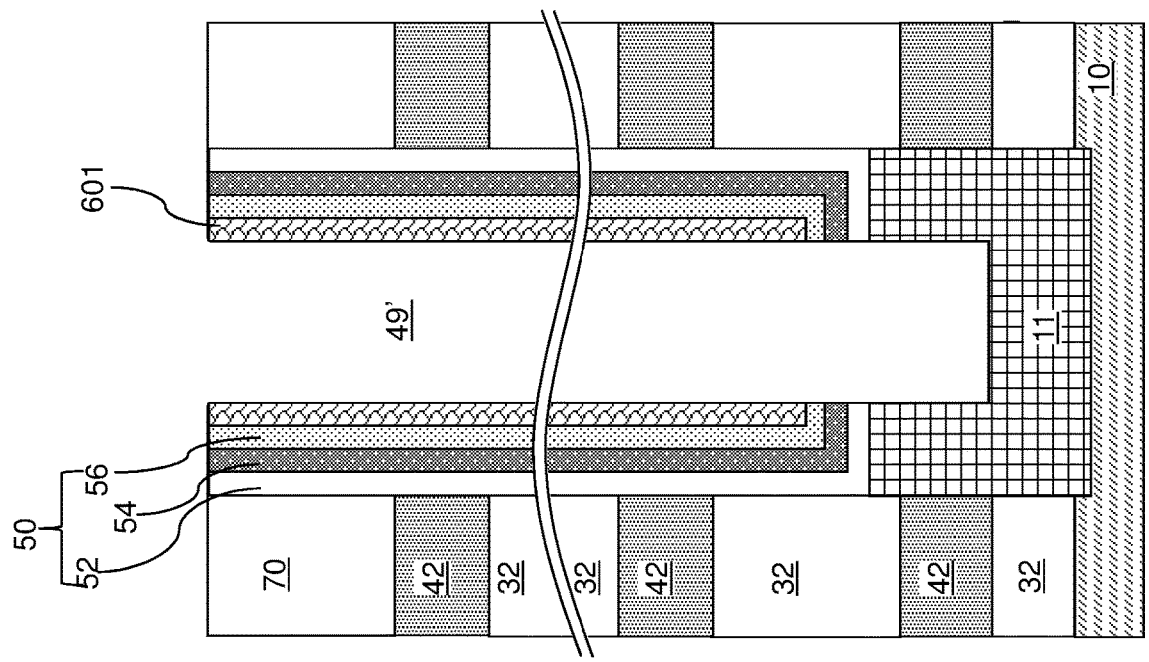
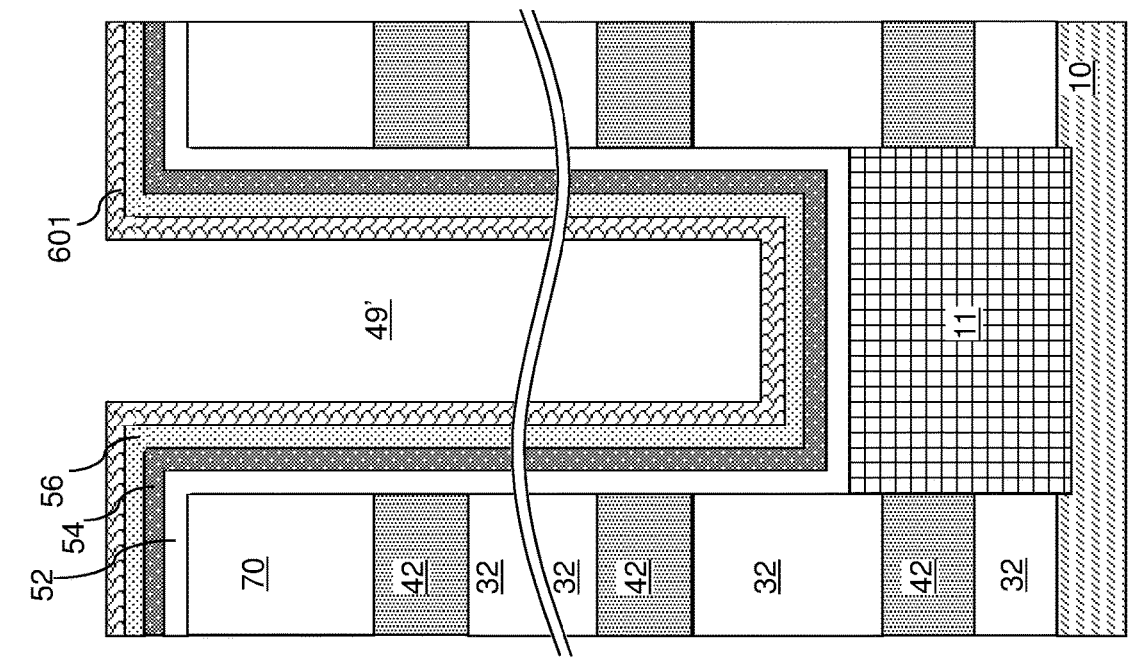

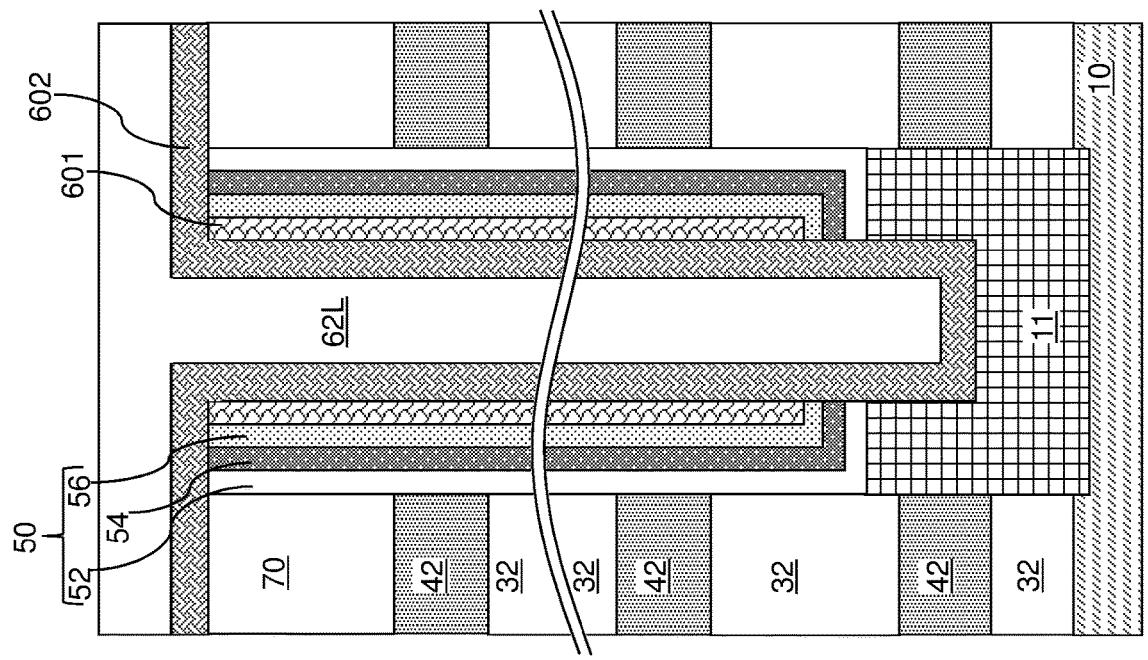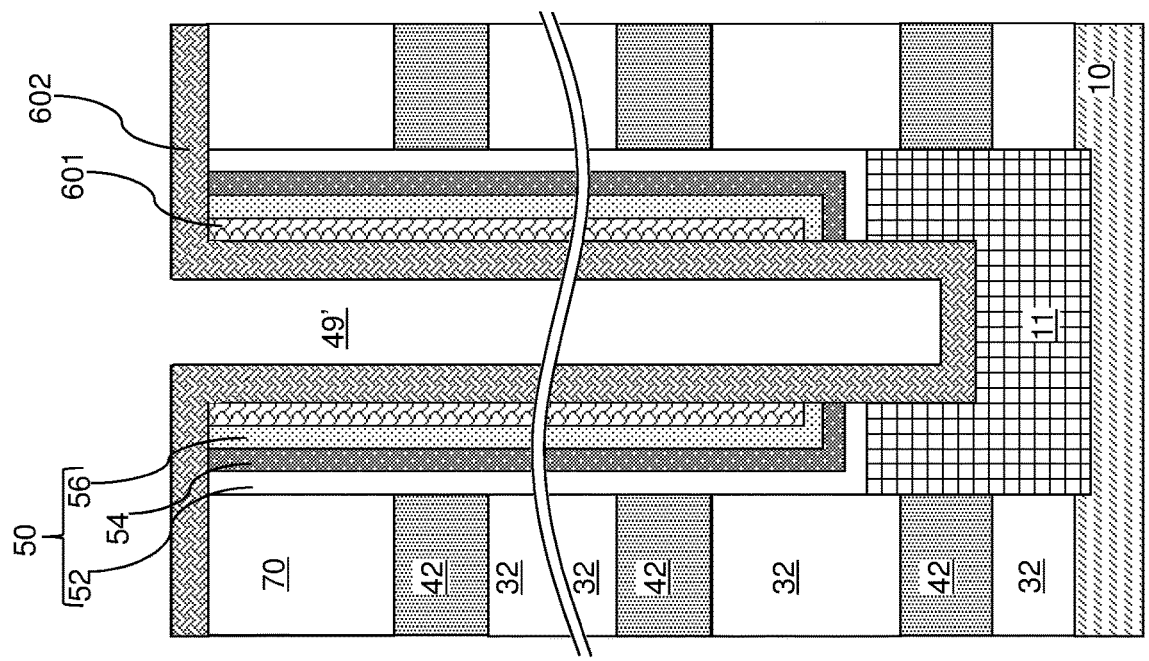

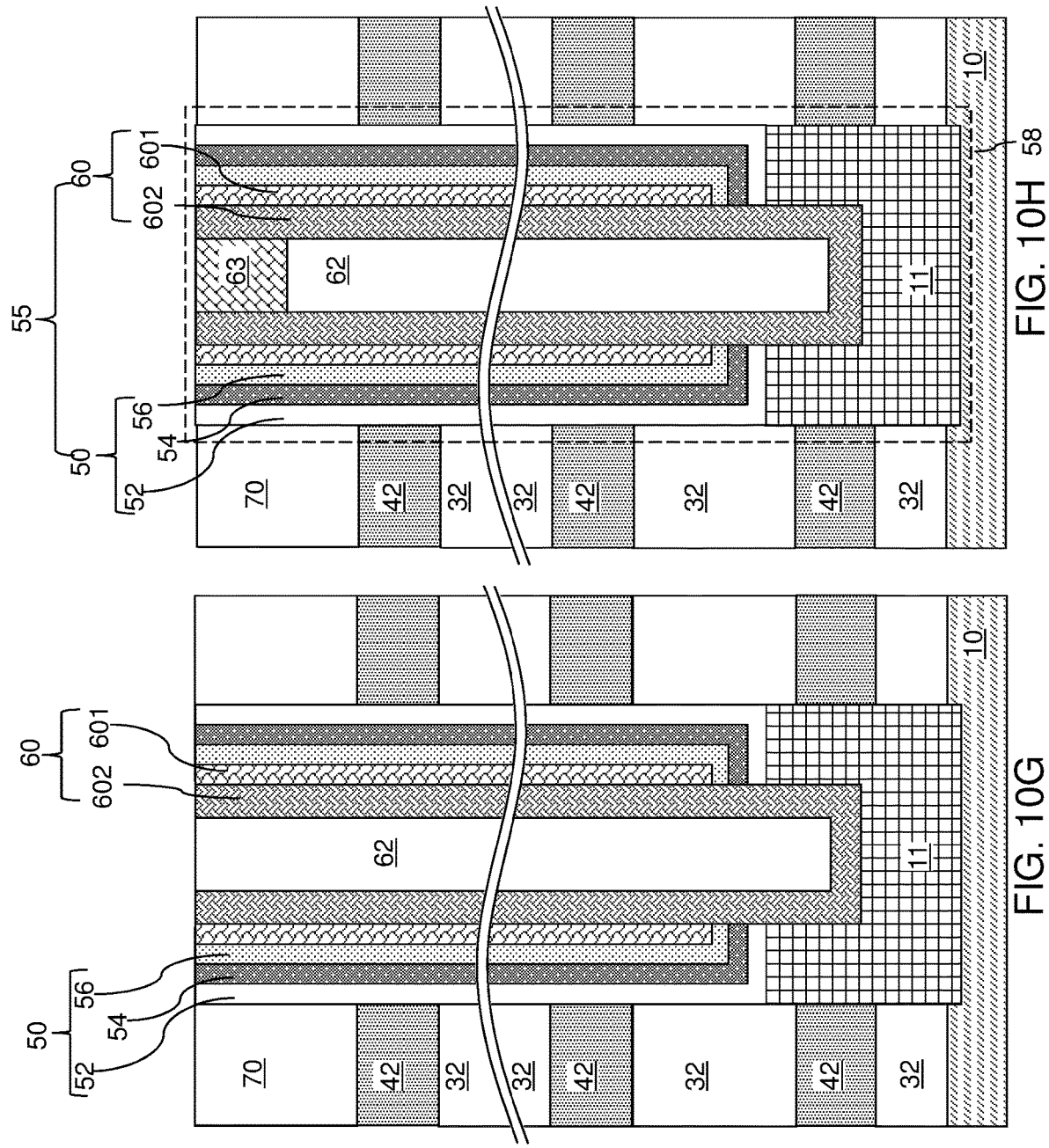

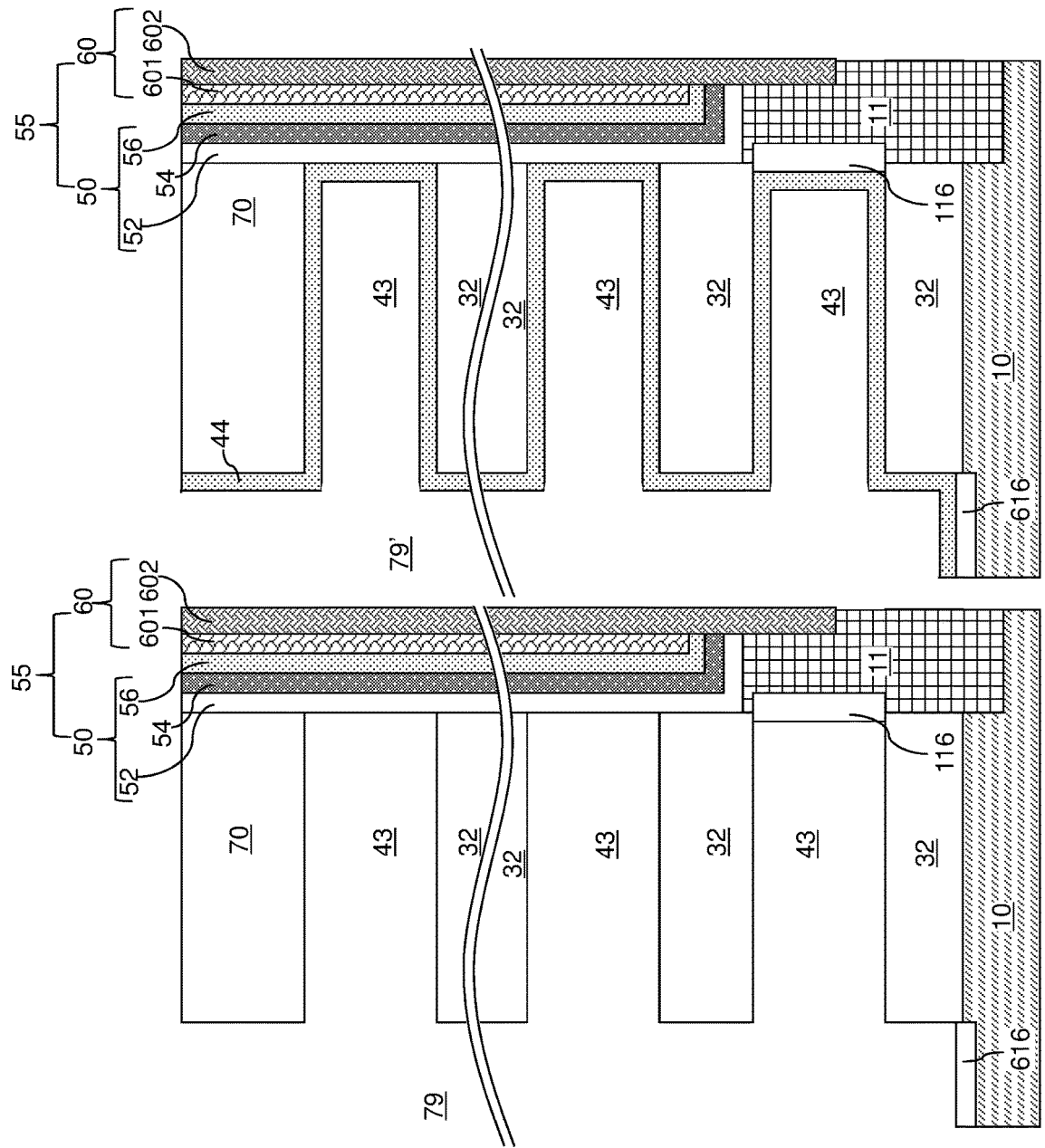

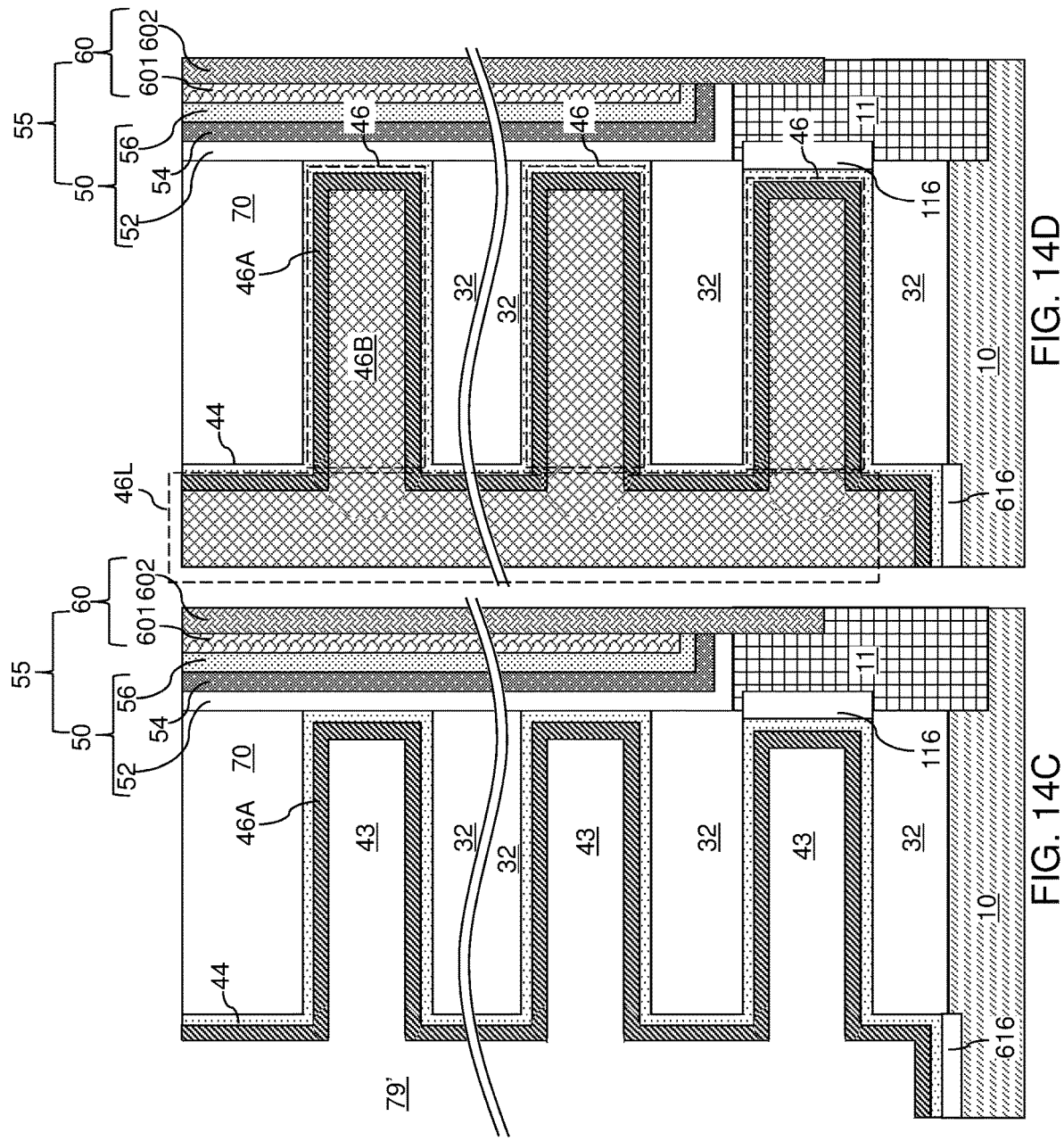

US 10,658,381 B1

MEMORY DIE HAVING WAFER WARPAGE REDUCTION THROUGH STRESS BALANCING EMPLOYING ROTATED THREE-DIMENSIONAL MEMORY ARRAYS AND METHOD OF MAKING THE SAME

FIELD

The present disclosure relates generally to the field of semiconductor devices, and particular to methods for wafer warpage reduction by stress balancing through the use of rotated memory blocks including three-dimensional memory devices and structures formed by the same.

BACKGROUND

A three-dimensional memory device including vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Memory stack structures may be formed on a semiconductor chip through an alternating stack of insulating layers and electrically conductive layers that function as word lines. Various additional structures vertically extend through the alternating stack. Local variations in the material composition in the memory stack structures may induce stress that deforms or warps the semiconductor wafer upon which structures are formed. The deformation or warping may cause difficulty in subsequent processing steps that may include chip bonding or packaging.

SUMMARY

According to an aspect of the present disclosure, a memory die is provided, which comprises: at least one first plane including a plurality of first memory blocks; and at least one second plane including a plurality of second memory blocks. Each memory block selected from the plurality of first memory blocks and the plurality of second memory blocks includes a respective set of memory stack structures that vertically extend through a respective alternating stack of insulating layers and electrically conductive layers. Each memory stack structure within the sets of memory stack structures comprises a respective vertical semiconductor channel and a respective memory film. Each of the at least one first plane includes a respective set of first bit lines that laterally extend along a first horizontal direction and electrically connected to a respective subset of vertical semiconductor channels. Each of the at least one second plane includes a respective set of second bit lines that are parallel with respect to one another and laterally extend along a second horizontal direction that is perpendicular to the first horizontal direction and electrically connected to a respective subset of vertical semiconductor channels within the at least one second plane.

According to another aspect of the present disclosure, a method of forming memory dies is provided. The method comprises: providing a set of reticles that include lithographic patterns for multiple exposure levels of at least one semiconductor die. A layout for each semiconductor die within the set of reticles comprises a first sub-layout for at least one first plane including a plurality of first memory blocks and a second sub-layout for at least one second plane including a plurality of second memory blocks. The memory dies may be formed on a wafer by performing a sequence of processing steps including deposition processes, etch processes, and lithographic patterning processes that employ the set of reticles, wherein the memory dies are physical implementations of a design for the at least one semiconductor die as embodied in the set of reticles. For each of the memory dies, each memory block selected from the plurality of first memory blocks and the plurality of second memory blocks includes a respective set of memory stack structures that vertically extend through a respective alternating stack of insulating layers and electrically conductive layers, wherein each memory stack structure within the sets of memory stack structures comprises a respective vertical semiconductor channel and a respective memory film. Each of the at least one first plane includes a respective set of first bit lines that laterally extend along a first horizontal direction and electrically connected to a respective subset of vertical semiconductor channels; and each of the at least one second plane includes a respective set of second bit lines that are parallel with respect to one another and laterally extend along a second horizontal direction that is perpendicular to the first horizontal direction and electrically connected to a respective subset of vertical semiconductor channels within the at least one second plane.

According to yet another aspect of the present disclosure, a method of forming memory dies is provided. The method comprises: providing a set of reticles that includes lithographic patterns for multiple exposure levels of a plurality of semiconductor dies, wherein a layout for one of at least one first-type semiconductor die within the plurality of semiconductor dies is congruent, with or without a mirror symmetry reflection, with a layout for one of at least one second-type semiconductor die within the plurality of semiconductor dies, and is rotated, with or without a mirror symmetry reflection, from the layout for the one of the at least one first-type semiconductor die by 90 degrees or 270 degrees; and forming memory dies on a wafer by performing a sequence of processing steps including deposition processes, etch processes, and lithographic patterning processes that employ the set of reticles, wherein the memory dies are physical implementations of a design for each of the plurality of semiconductor dies as embodied in the set of reticles. Each memory die comprises a respective set of memory blocks; and each of the memory blocks comprises a respective set of memory stack structures that vertically extend through a respective alternating stack of insulating layers and electrically conductive layers, wherein each memory stack structure within the sets of memory stack structures comprises a respective vertical semiconductor channel and a respective memory film.

According to still another aspect of the present disclosure, a method of forming memory dies is provided. The method comprises: providing a set of reticles that include lithographic patterns for multiple exposure levels of at least one semiconductor die; and forming memory dies on a wafer by performing a sequence of processing steps including deposition processes, etch processes, and lithographic patterning processes that employ the set of reticles, wherein the memory dies are physical implementations of a design for the at least one semiconductor die as embodied in the set of reticles. Each of the lithographic patterning steps comprises: a photoresist application step in which a photoresist layer is applied over the wafer; a first lithographic exposure step in which the photoresist layer is lithographically exposed within a lithographic pattern in a respective reticle selected from the set of reticles in a plurality of first exposure fields over the wafer while the wafer is oriented at a first rotational angle with respect to orientations of the first exposure fields about an vertical axis passing through a geometrical center of the wafer; and a second lithographic exposure step in which the photoresist layer is lithographically exposed within the lithographic pattern in the respective reticle selected from the set of reticles in a plurality of second exposure fields over the wafer while the wafer is oriented at a second rotational angle with respect to orientations of the second exposure fields about the vertical axis passing through the geometrical center of the wafer.

BRIEF DESCRIPTION OF THE DRAWINGS

FIG. 6 is a vertical cross-sectional view of an exemplary structure after formation of at least one peripheral device, and a semiconductor material layer according to an embodiment of the present disclosure.

FIGS. 10A-10H are sequential schematic vertical cross-sectional views of a memory opening within the exemplary structure during formation of a memory stack structure, an optional dielectric core, and a drain region therein according to an embodiment of the present disclosure.

FIGS. 14A-14D are sequential vertical cross-sectional views of a region of the exemplary structure during formation of electrically conductive layers according to an embodiment of the present disclosure.

DETAILED DESCRIPTION

Figure 1:
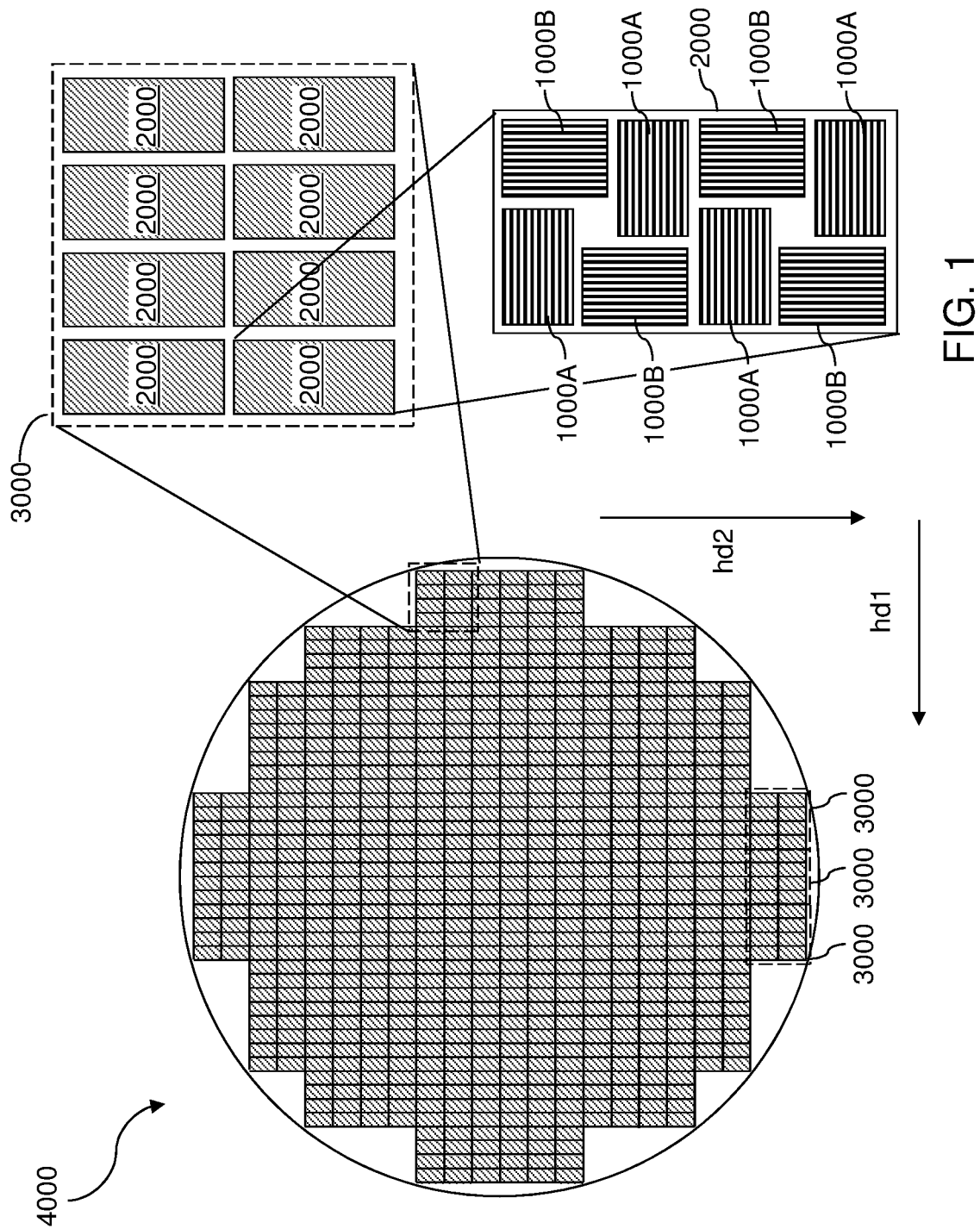
FIG. 1 illustrates a schematic view of a layout of exposure fields on a wafer, a layout of memory dies within an exposure field, and a layout of planes within a memory die according to a first embodiment of the present disclosure.

Memory stack structures including a respective memory film and a respective vertical semiconductor channel are formed through an alternating stack of insulating layers and electrically conductive layers that function as word lines. Various additional structures vertically extend through the alternating stack. Such additional structures may include source contact lines, dielectric wall structures that separate neighboring pairs of alternating stacks, and/or through-array contact via structures. Local variations in the material composition in the three-dimensional array device induces stress that deforms the semiconductor chip, which cause difficulty in subsequent processing steps that may include chip bonding or packaging. Normally, process conditions are optimized to minimize stress. However, such methods of optimizing process conditions may not be effective. In addition, a degradation of Cell and CMOS devices may be seen as a side effect of such conventional approaches. Thus, a method is desired to minimize the deformation of the semiconductor chip due to stress.

As discussed above, embodiments are disclosed herein that may be directed to methods for wafer warpage reduction through stress balancing by using rotated memory blocks including three-dimensional memory devices and structures formed by the same, the various aspects of which are described below. Various embodiments may form various structures including a multilevel memory structure, non-limiting examples of which include semiconductor devices such as three-dimensional monolithic memory array devices comprising a plurality of NAND memory strings. Embodiment structures may be formed to equally distribute stress due to local variations in the material composition in the memory stack structures in x and y-directions to minimize warpage.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming, i.e., a smallest unit on which a programming operation may be performed.

Figure 2A:
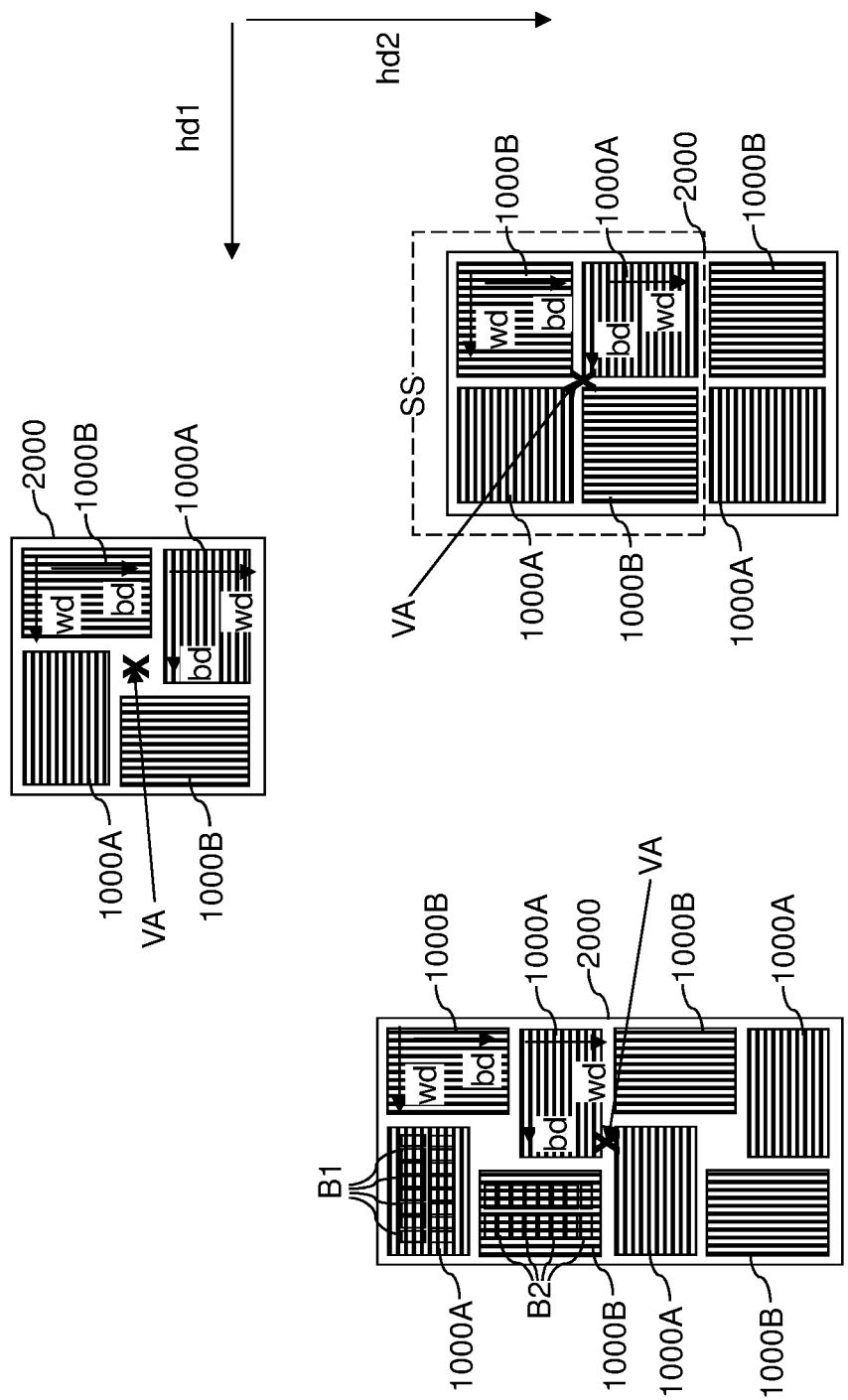
FIG. 2A illustrates schematic layouts of exemplary memory dies that may be used on the wafer of FIG. 1.
Figure 2B:
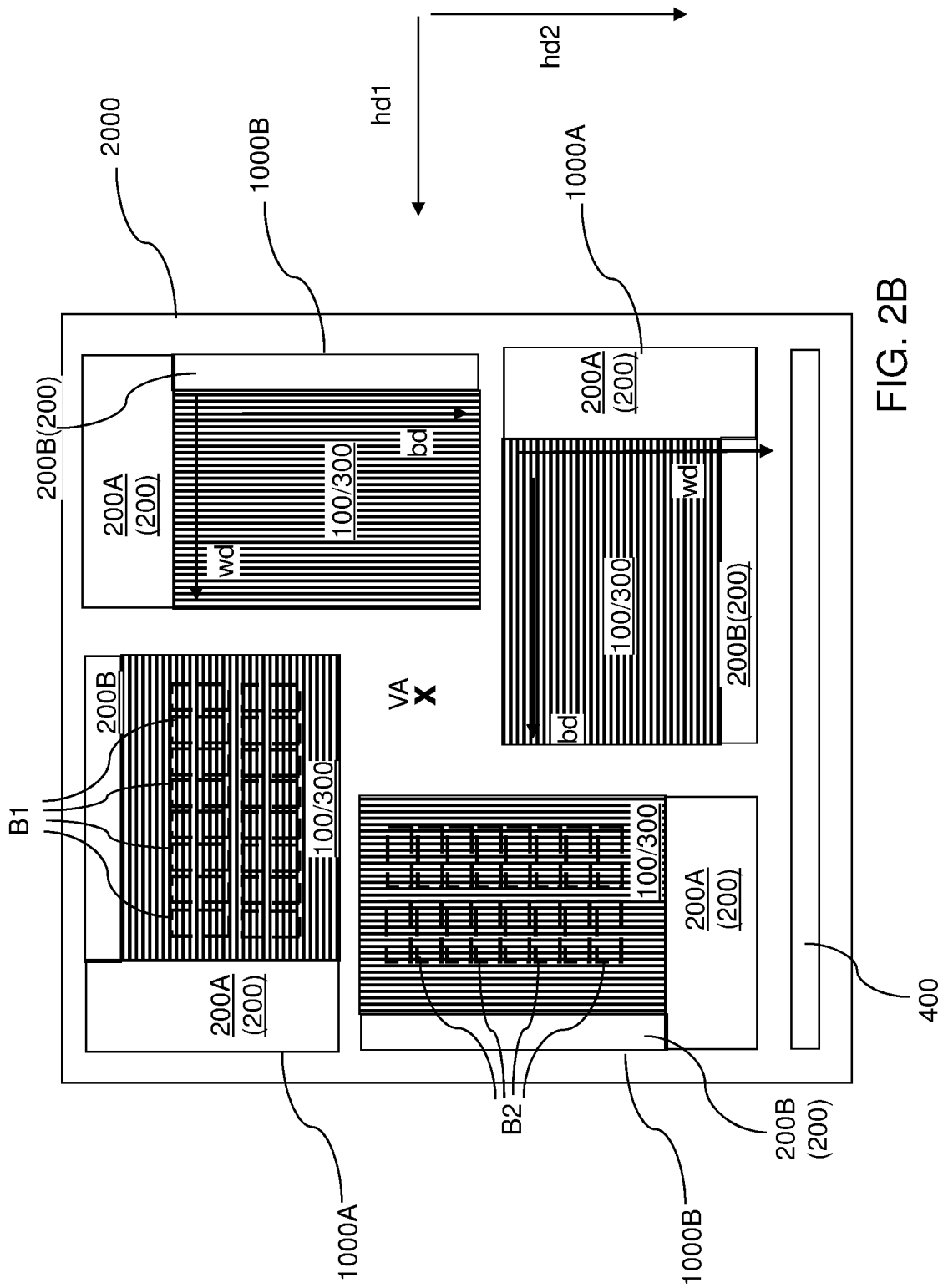
FIG. 2B illustrates a schematic layout of another memory die that may be used on the wafer of FIG. 1.
Figure 2C:
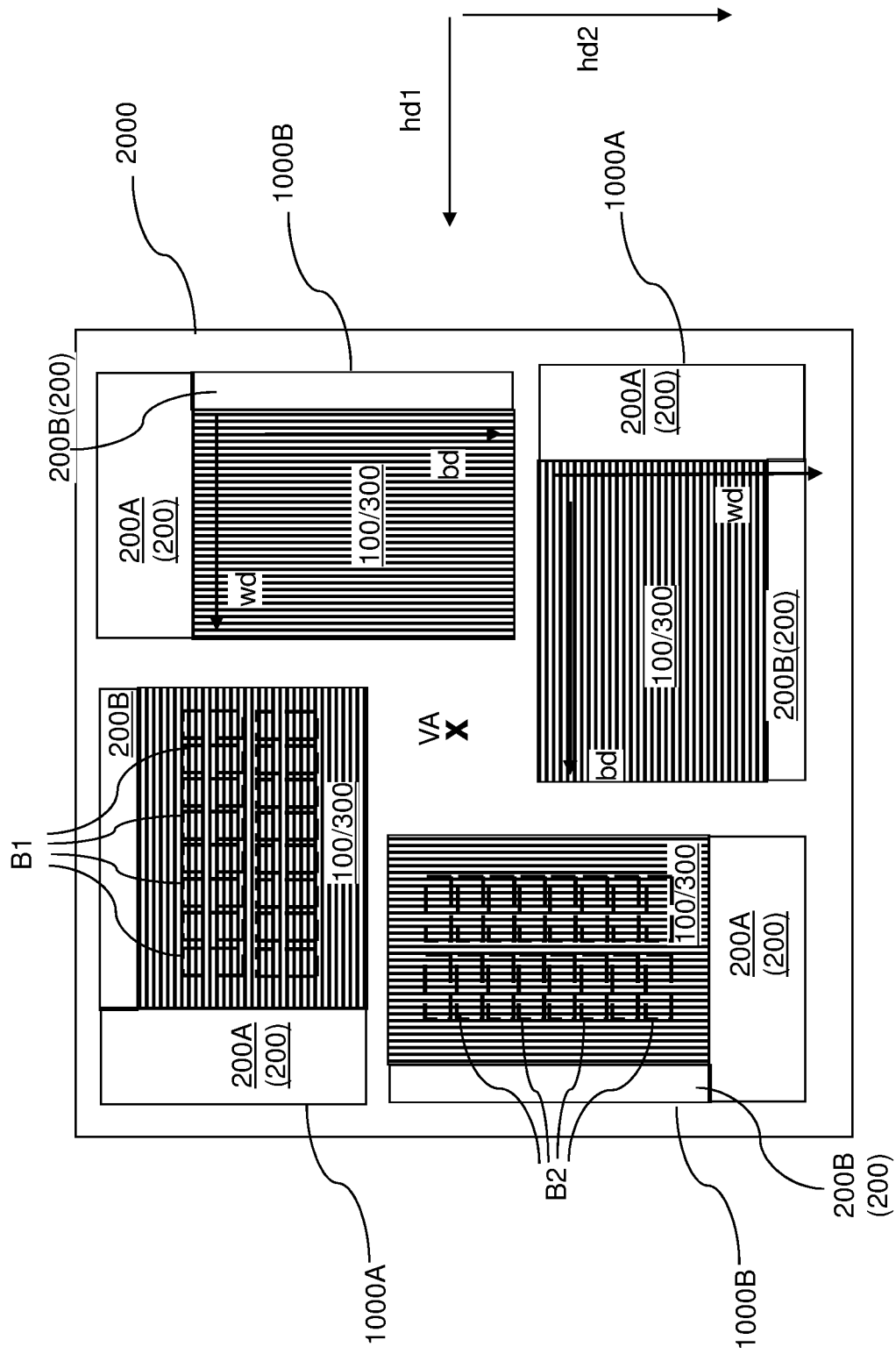
FIG. 2C illustrates a schematic layout of yet another memory die that may be used on the wafer of FIG. 1.

Referring to FIGS. 1, 2A, 2B, and 2C, a layout of exposure fields 3000 on a wafer 4000, a layout of semiconductor dies 2000 within an exposure field 3000, and a layout of planes (1000A, 1000B) within a semiconductor die 2000 are illustrated. FIG. 1 illustrates the various layouts on a wafer 4000, which may be a commercially available semiconductor substrate. FIGS. 2A-2C illustrate various layouts of planes (1000A, 1000B) within exemplary semiconductor dies 2000 in various configurations. The layout of each semiconductor die 2000 may be selected such that multiple planes (1000A, 1000B) within the semiconductor die 2000 have different layouts that provide the same mechanical stress along a first horizontal direction hd1 and a second horizontal direction hd2 that is perpendicular to the first horizontal direction hd2.

Each exposure field 3000 corresponds to the area of the wafer 4000 that is lithographically exposed during a single illumination step in a lithographic exposure tool. In case semiconductor dies 2000 are manufactured employing lithographic exposure and development processes, each exposure field 3000 may correspond to the area of a single semiconductor die 2000, or may correspond to the area of a plurality of semiconductor dies 2000. In one embodiment, the exposure fields 3000 may be arranged as a subset of a rectangular array such that the exposure fields 3000 are arranged as rows and columns that fit within the area of the wafer 4000. The rows and columns of the rectangular array may be arranged along the first horizontal direction hd1 and along the second horizontal direction hd2. During each lithographic exposure process, a photoresist layer may be applied over the wafer 4000 and each exposure field 3000 may be sequentially lithographically exposed. Upon completion of lithographic exposure of all exposure fields 3000, the photoresist layer may be developed to generate a pattern in the developed photoresist layer. A suitable processing step such as an etch step, a deposition step, and/or an ion implantation step may be performed employing the patterned photoresist layer. Generally, manufacture of semiconductor dies 2000 uses a sequence of processing steps including deposition steps, planarization steps, lithographic patterning steps, and etch steps. Each lithographic patterning step uses a reticle for lithographic exposure.

A set of reticles may be provided to manufacture semiconductor dies 2000. The set of reticles includes lithographic patterns for multiple exposure levels of at least one semiconductor die 2000, such as a memory die. In other words, each exposure field 3000 may include a pattern for a single semiconductor die 2000, or a pattern for a plurality of semiconductor dies 2000.

Each semiconductor die 2000 may include a plurality of planes (1000A, 1000B). Thus, each layout for each semiconductor die 2000 within the set of reticles comprises a first sub-layout for at least one first plane 1000A including a plurality of first memory blocks and a second sub-layout for at least one second plane 1000B including a plurality of second memory blocks. As used herein, a "sub-layout" refers to a subset of a layout that has a lesser area than the entire area of the layout. According to an aspect of the present disclosure, the sub-layout for each first plane 1000A is different from the sub-layout for each second plane 1000B. In case multiple first planes 1000A and multiple second planes 1000B are present within a semiconductor die 2000, the sub-layout for each of the multiple first planes 1000A may be the same throughout, and the sub-layout for each of the multiple second planes 1000B may be the same throughout.

In one embodiment, memory dies may be manufactured as the semiconductor dies 2000. The memory dies 2000 may be manufactured on the wafer 4000 by performing a sequence of processing steps including deposition processes, etch processes, and lithographic patterning processes that employ the set of reticles. The manufactured memory dies 2000 (i.e., the physical memory dies) are physical implementations of a design for the at least one semiconductor die 2000 as embodied in the set of reticles.

Each first plane 1000A may include a respective plurality of first memory blocks B1, which are multiple implementations of a first block design. Each second plane 1000B may include a respective plurality of second memory blocks B2, which are multiple implementations of a second block design that may be rotated from the first block design by 90 degrees or 270 degrees. In one embodiment, each memory block (B1, B2) respectively selected from the plurality of first memory blocks B1 and the plurality of second memory blocks B2 includes a respective set of memory stack structures that vertically extend through a respective alternating stack of insulating layers and electrically conductive layers for each of the memory dies 2000. Each memory stack structure within the sets of memory stack structures comprises a respective vertical semiconductor channel and a respective memory film. An exemplary structure for a set of memory stack structures is described in detail in a subsequent section.

In some embodiments, each of the first planes 1000A and the second planes 1000B may include a memory array region 100, staircase regions 300 adjoined to the memory array region 100, and peripheral device regions 200. The memory array region 100 includes a respective set of memory stack structures vertically extending through alternating stacks of insulating layers and electrically conductive layers embodying the word lines for the memory stack structures, and bit lines connected to vertical semiconductor channels within the memory stack structures. Each staircase region 300 includes stepped surfaces of the electrically conductive layers on which word line contact via structures are formed. The peripheral device regions 200 include peripheral devices that support operation of the memory elements within the memory stack structures. In an illustrative example, a set of peripheral device regions 200 within a plane (1000A or 1000B) may include a first peripheral device region 200A including a bit line decoder circuitry, a bit line driver circuitry, and sense amplifiers, and a second peripheral device region 200B including a word line decoder circuitry and a word line driver circuitry.

In one embodiment, each of the at least one first plane 1000A within a memory die 2000 includes a respective set of first bit lines that laterally extend along a first horizontal direction hd1 (represented as the "bd" direction within first planes 1000A of FIGS. 2A-2C) and electrically connected to a respective subset of vertical semiconductor channels. Each of the at least one second plane 1000B includes a respective set of second bit lines that are parallel with respect to one another and laterally extend along a second horizontal direction hd2 (represented by the "bd" direction within second planes 1000B of FIGS. 2A-2C) that is perpendicular to the first horizontal direction hd1 and electrically connected to a respective subset of vertical semiconductor channels within the at least one second plane 1000B.

The word lines for each plane (1000A or 1000B) may be perpendicular to the bit lines for the same plane (1000A or 1000B). In one embodiment, each of the at least one first plane 1000A within a memory die 2000 includes a respective set of first word lines that laterally extend along the second horizontal direction hd2 (represented as the "wd" direction within first planes 1000A of FIGS. 2A-2C) and embodied as a respective electrically conductive layer within the first plane 1000A. Each of the at least one second plane 1000B includes a respective set of second word lines that are parallel with respect to one another and laterally extend along the first horizontal direction hd1 (represented by the "wd" direction within second planes 1000B of FIGS. 2A-2C) and embodied as a respective electrically conductive layer within the second plane 1000B.

In one embodiment, electrically conductive layers within the at least one first plane 1000A comprise word lines for a respective one of the first memory blocks B1 and laterally extend along the second horizontal direction hd2, and electrically conductive layers within the at least one second plane 1000B comprise word lines for a respective one of the second memory blocks B2 and laterally extend along the first horizontal direction hd1.

According to an aspect of the present disclosure, each memory die 2000 may include at least one first plane 1000A and at least one second plane 1000B such that the lateral stress along the first horizontal direction hd1 is balanced with the lateral stress along the second horizontal direction hd2. In other words, the overall magnitude and type of lateral stress applied by each memory die 2000 to neighboring memory dies 2000 along the first horizontal direction hd1 may be substantially the same as the overall magnitude and type of lateral stress applied by each memory die 2000 to neighboring memory dies 2000 along the second horizontal direction hd2. In this case, deformation of the wafer 4000 along the first horizontal direction hd1 may have the same magnitude and type as deformation of the wafer 4000 along the second horizontal direction hd2. For example, if deformation of the wafer 4000 along the first horizontal direction hd1 during, and after, manufacture of the memory dies 2000 on the wafer 4000 includes downward bowing of the wafer 4000 with a radius of curvature within a vertical plane including the first horizontal direction hd1, deformation of the wafer 4000 along the second horizontal direction hd2 during, and after, manufacture of the memory dies 2000 on the wafer 4000 also includes downward bowing of the wafer 4000 with the same radius of curvature within a vertical plane including the second horizontal direction hd2. Thus, saddle-shaped deformation or deformation having different radii of curvature along different horizontal directions may be avoided for the wafer 4000, and post-manufacture processing of the memory die 2000 (such as formation of a bonded assembly of dies) may be facilitated.

In one embodiment, each of the memory dies 2000 includes a same total number of the at least one first plane 1000A as a total number of the at least one second plane 1000B, and memory stack structures within each of the at least one second plane 1000B has a layout that is rotated, with or without a mirror symmetry reflection, from a layout of memory stack structures within one of the at least one first plane 1000A by 90 degrees or 270 degrees. As used herein, rotation of a layout refers to rotation of the entirety of the layout within the two-dimensional plane including the layout. As used herein, a mirror symmetry reflection refers to a reflection about the word line direction or about the bit line direction of a layout. In the examples illustrated in FIGS. 2A-2C, the total number of the at least one first plane 1000A (which is the same as the total number of the at least one second plane 1000B) within a memory die 2000 may be 2, 3, or 4. In addition, embodiments are expressly contemplated in which the total number of the at least one first plane 1000A within a memory die 2000 may be 1, 2, 3, 4, 5, 6, etc.

In one embodiment, the at least one first plane 1000A within each memory die 2000 comprises a plurality of first planes 1000A, and the at least one second plane 1000B within each memory die 2000 comprises a plurality of second planes 1000B. A total area of the plurality of first planes 1000A within each memory die 2000 is the same as a total area of the plurality of second planes 1000B within each memory die 2000.

In one embodiment, at least a subset SS of the plurality of first planes 1000A and the plurality of second planes 1000B within each memory die 2000 may be arranged with an inversion symmetry with respect to a vertical axis VA passing through a geometrical center of the subset of the plurality of first planes 1000A and the plurality of second planes 1000B. The subset SS of the plurality of first planes 1000A and the plurality of second planes 1000B within each memory die 2000 may include all, or less than all, of the first planes 1000A and the second planes 1000B in the memory die 2000. As used herein, an "inversion symmetry" refers to the change of signs for all x-coordinates and y-coordinates generated employing a point of symmetry (such as the vertical axis VA passing through the geometrical center of a set of planes (1000A, 1000B)) as the origin for the coordinate system. Exemplary vertical axes VA pasting through the geometrical center of the respective subset of the plurality of first planes 1000A and the plurality of second planes 1000B are illustrated in FIGS. 2A-2C.

Upon completion of manufacture of the memory dies 2000 on the wafer 4000, the memory dies 2000 may be singulated by dicing. The memory dies 2000 formed employing the layouts illustrated in FIGS. 1 and 2A-2C may include layout features that equalize mechanical deformation along two orthogonal directions of each memory die 2000, which may be the horizontal direction that is parallel to a first pair of sidewalls of the memory die 2000 and the horizontal direction that is parallel to a second pair of sidewalls of the memory die 2000.

According to an aspect of the present disclosure, a discrete memory die 2000 is provided by dicing the memory dies 2000 on the wafer 4000. The discrete memory die 2000 comprises: at least one first plane 1000A including a plurality of first memory blocks B1; and at least one second plane 1000B including a plurality of second memory blocks B2. Each memory block (B1, B2) respectively selected from the plurality of first memory blocks B1 and the plurality of second memory blocks B2 includes a respective set of memory stack structures that vertically extend through a respective alternating stack of insulating layers and electrically conductive layers. Each memory stack structure within the sets of memory stack structures comprises a respective vertical semiconductor channel and a respective memory film. Each of the at least one first plane 1000A includes a respective set of first bit lines that laterally extend along a first horizontal direction hd1 (which is the bit line direction "bd" in the respective first plane 1000A) and electrically connected to a respective subset of vertical semiconductor channels. Each of the at least one second plane 1000B includes a respective set of second bit lines that are parallel with respect to one another and laterally extend along a second horizontal direction hd2 (which is the bit line direction "bd" in the respective second plane 1000B) that is perpendicular to the first horizontal direction hd1 and electrically connected to a respective subset of vertical semiconductor channels within the at least one second plane 1000B.

In one embodiment, electrically conductive layers within the at least one first plane 1000A comprise word lines for a respective one of the first memory blocks B1 and laterally extend along the second horizontal direction hd2 (which is the word line direction "wd" in the respective first plane 1000A). Electrically conductive layers within the at least one second plane 1000B comprise word lines for a respective one of the second memory blocks and laterally extend along the first horizontal direction hd1 (which is the word line direction "wd" in the respective second plane 1000B).

In one embodiment, first memory blocks B1 within each first plane 1000A are laterally spaced apart respectively from one another by first trenches (such as backside trenches to be described below) that laterally extend along the second horizontal direction hd2 (which is the word line direction "wd" for the first plane 1000A), and second memory blocks B2 within each second plane 1000B are laterally spaced apart respectively from one another by second trenches (such as backside trenches to be described below) that laterally extend along the first horizontal direction hd1 (which is the word line direction "wd" for the second plane 1000B). In one embodiment, each of the first bit lines extends over a respective plurality of first memory blocks B1, and each of the second bit lines extends over a respective plurality of second memory blocks B2. In one embodiment shown in FIG. 2B, each semiconductor die 2000 may include an input/output circuit 400. In another embodiment shown in FIG. 2C, the input/output circuit 400 may be omitted from some or all semiconductor dies 2000.

The dicing channels used to singulate the semiconductor dies 2000 on the wafer 4000 may be parallel to the first horizontal direction hd1 or the second horizontal direction hd2. Each semiconductor die 2000 after singulation may comprise: a pair of first sidewalls that are parallel to the first horizontal direction hd1; a pair of second sidewalls that are parallel to the second horizontal direction hd2; a planar top surface adjoined to an upper edge of each of the pair of first sidewalls; and a planar bottom surface adjoined to a lower edge of each of the pair of second sidewalls.

In one embodiment, the memory die 2000 includes a same total number of the at least one first plane 1000A as a total number of the at least one second plane 1000B, and memory stack structures within each of the at least one second plane 1000B has a layout that is rotated from a layout of memory stack structures within one of the at least one first plane by 90 degrees or 270 degrees.

Figure 3:
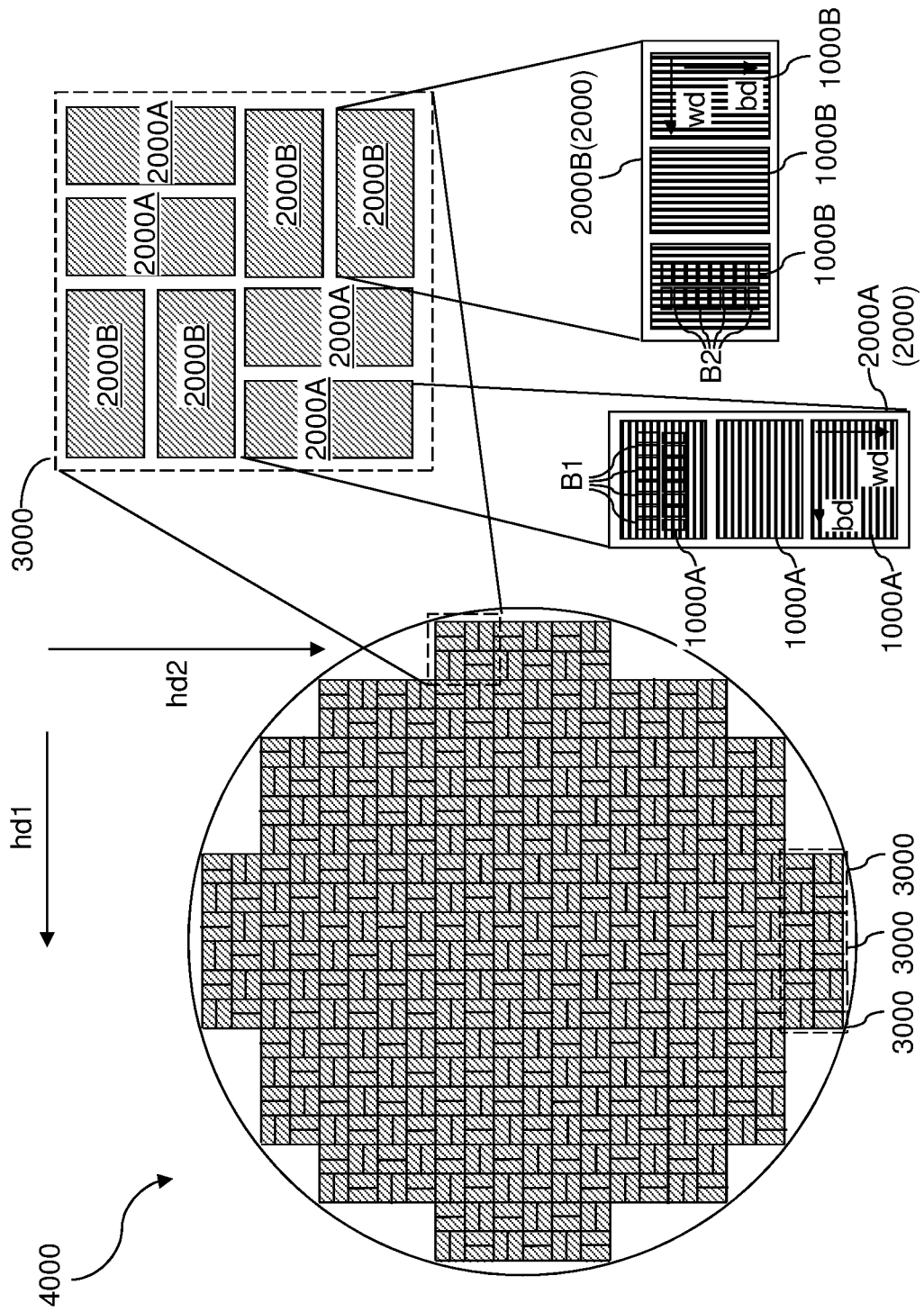
FIG. 3 illustrates a schematic view of a layout of exposure fields on a wafer, a layout of memory dies within an exposure field, and a layout of planes within a memory die according to a second embodiment of the present disclosure.

Referring to FIG. 3, a layout of exposure fields 3000 on a wafer 4000, a layout of semiconductor dies 2000 within an exposure field 3000, and a layout of planes (1000A, 1000B) within a semiconductor die 2000 are illustrated. The wafer 4000 may be a commercially available semiconductor substrate. The layout of each exposure field 3000 may be selected such that multiple semiconductor dies 2000 within the exposure field 3000 have different orientations that provide the same mechanical stress along a first horizontal direction hd1 and a second horizontal direction hd2 that is perpendicular to the first horizontal direction hd2. Each exposure field 3000 includes patterns for at least one first-type semiconductor die 2000A (which may be at least one first-type memory die) and at least one second-type semiconductor die 2000B (which may be at least one second-type memory die). For example, at least one first-type semiconductor die 2000A within each exposure field 3000 includes a set of at least one first plane 1000A including bit lines that extends along the first horizontal direction hd1, and a second group of at least one semiconductor die 2000B within each exposure field 3000 includes at least one second plane 1000B including bit lines that extends along the second horizontal direction hd2.

Generally, a set of reticles that includes lithographic patterns for multiple exposure levels of a plurality of semiconductor dies is provided. A layout for one of at least one first-type semiconductor die 2000A within the plurality of semiconductor dies 2000 is congruent, with or without a mirror symmetry reflection, with a layout for one of at least one second-type semiconductor die 2000B within the plurality of semiconductor dies 2000, and is rotated, with or without a mirror symmetry reflection, from the layout for the one of the at least one first-type semiconductor die 2000A by 90 degrees or 270 degrees. In one embodiment, the layout for each first-type semiconductor die 2000A may be congruent, with or without a mirror symmetry reflection, with the layout for each second-type semiconductor die 2000B, and is rotated, with or without a mirror symmetry reflection, from the layout for the first-type semiconductor die 2000A by 90 degrees or 270 degrees.

In one embodiment, the semiconductor dies 2000 may be memory dies 2000. The memory dies 2000 may be formed on the wafer by performing a sequence of processing steps including deposition processes, etch processes, and lithographic patterning processes that employ the set of reticles. The memory dies 2000 are physical implementations of a design for each of the plurality of semiconductor dies 2000 as embodied in the set of reticles. Each memory die 2000 comprises a respective set of memory blocks (B1, B2). Each of the memory blocks (B1, B2) comprises a respective set of memory stack structures that vertically extend through a respective alternating stack of insulating layers and electrically conductive layers. Each memory stack structure within the sets of memory stack structures comprises a respective vertical semiconductor channel and a respective memory film. Each of the memory dies 2000 comprises bit lines that are parallel with respect to one another and electrically connected to a respective subset of memory stack structures within a respective one of the memory dies 2000.

In one embodiment, all patterns for the bit lines within memory array regions in the layout for the one of the at least one first-type semiconductor die 2000A laterally extend along a first horizontal direction hd1 (which is the bit line direction "bd" within each first-type semiconductor die 2000A), and all patterns for the bit lines within memory array regions in the layout for the one of the at least one second-type semiconductor die 2000B laterally extend along a second horizontal direction hd2 (which is the bit line direction "bd" within each second-type semiconductor die 2000B) that is perpendicular to the first horizontal direction hd1.

In one embodiment, all patterns for the word lines within memory array regions in the layout for the one of the at least one first-type semiconductor die 2000A laterally extend along the second horizontal direction hd2 (which is the word line direction "wd" within each first-type semiconductor die 2000A), and all patterns for the word lines within memory array regions in the layout for the one of the at least one second-type semiconductor die 2000B laterally extend along the first horizontal direction hd1 (which is the word line direction "wd" within each second-type semiconductor die 2000B).

In one embodiment, the at least one first-type semiconductor die 2000A within the plurality of semiconductor dies 2000 in an exposure field 3000 comprises a plurality of first-type semiconductor dies 2000A, and the at least one second-type semiconductor die 2000B within the plurality of semiconductor dies 2000 comprises a plurality of second-type semiconductor dies 2000B. A total number of the plurality of first-type semiconductor dies 2000A in an exposure field 3000 may be the same as a total number of the plurality of second-type semiconductor dies 2000B in the exposure field 3000. The total number of the plurality of first-type semiconductor dies 2000A in an exposure field 3000 may be 2, 3, 4, 5, 6, etc. Alternatively, the at least one first-type semiconductor die 2000A within the plurality of semiconductor dies 2000 in an exposure field 3000 comprises a single first-type semiconductor die 2000A, and the at least one second-type semiconductor die 2000B within the plurality of semiconductor dies 2000 comprises a single second-type semiconductor die 2000B.

In one embodiment, each layout for any of the plurality of first-type semiconductor dies 2000A is congruent, with or without a mirror symmetry reflection, with a layout for any of the plurality of second-type semiconductor dies 2000B, and is rotated, with or without a mirror symmetry reflection, from the layout for any of the plurality of second-type semiconductor dies 2000B by 90 degrees or 270 degrees.

According to an aspect of the present disclosure, each exposure field 3000 may include at least one first-type semiconductor die 2000A (which may be at least one first-type memory die) and at least one second semiconductor die 2000B (which may be at least one second-type memory die) such that the lateral stress along the first horizontal direction hd1 is balanced with the lateral stress along the second horizontal direction hd2. In other words, the overall magnitude and type of lateral stress applied by a set of semiconductor dies 2000 within each exposure field 3000 to semiconductor dies 2000 within a neighboring exposure field 3000 along the first horizontal direction hd1 may be substantially the same as the overall magnitude and type of lateral stress applied by the set of semiconductor dies 2000 within the exposure field 3000 to semiconductor dies 2000 within another neighboring exposure field 3000 along the second horizontal direction hd2. In this case, deformation of the wafer 4000 along the first horizontal direction hd1 may have the same magnitude and type as deformation of the wafer 4000 along the second horizontal direction hd2. For example, if deformation of the wafer 4000 along the first horizontal direction hd1 during, and after, manufacture of the memory dies 2000 on the wafer 4000 includes downward bowing of the wafer 4000 with a radius of curvature within a vertical plane including the first horizontal direction hd1, deformation of the wafer 4000 along the second horizontal direction hd2 during, and after, manufacture of the memory dies 2000 on the wafer 4000 also includes downward bowing of the wafer 4000 with the same radius of curvature within a vertical plane including the second horizontal direction hd2. Thus, saddle-shaped deformation or deformation having different radii of curvature along different horizontal directions may be avoided for the wafer 4000, and post-manufacture processing of the memory die 2000 (such as formation of a bonded assembly of dies) may be facilitated.

Figure 4:
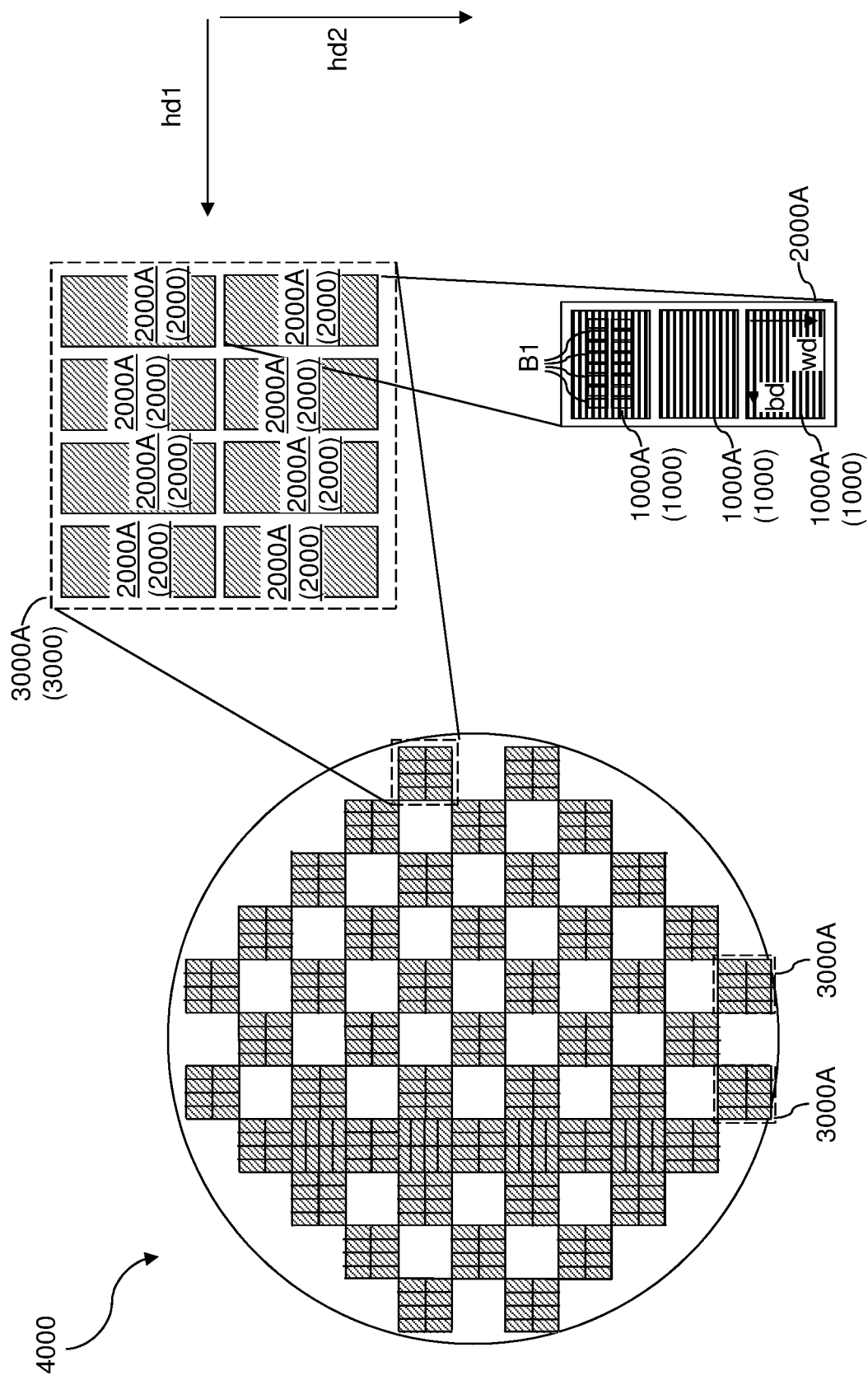
FIG. 4 illustrates a schematic view of a layout of first exposure fields on a wafer, a layout of memory dies within a first exposure field, and a layout of planes within a memory die after a first exposure step of a lithography process according to a third embodiment of the present disclosure.
Figure 5A:
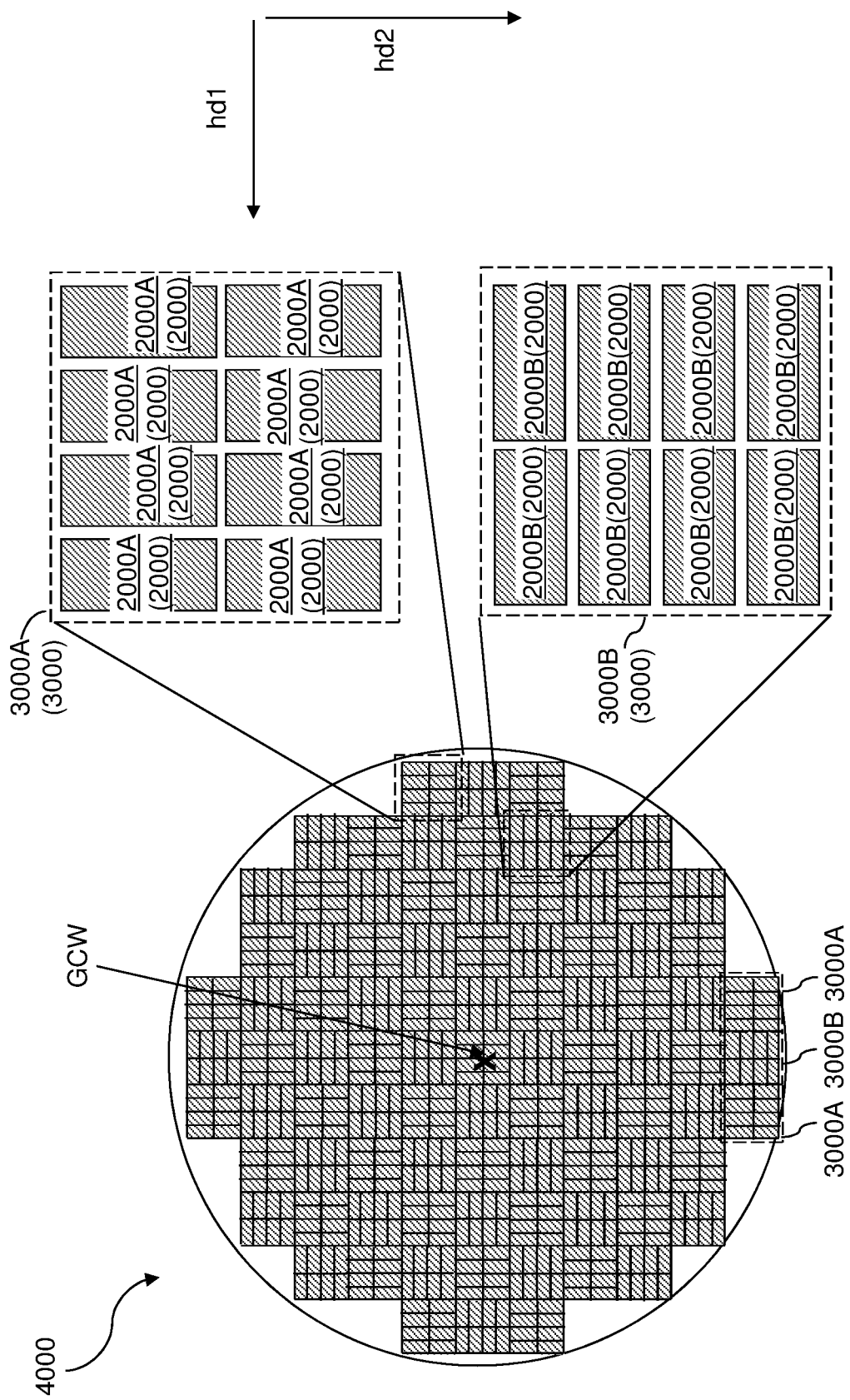
FIG. 5A illustrates a schematic view of a layout of first exposure fields and second exposure fields on a wafer, a layout of memory dies within a first exposure field, and a layout of memory dies within a second exposure field after a second exposure step of a lithography process according to a third embodiment of the present disclosure.
Figure 5B:
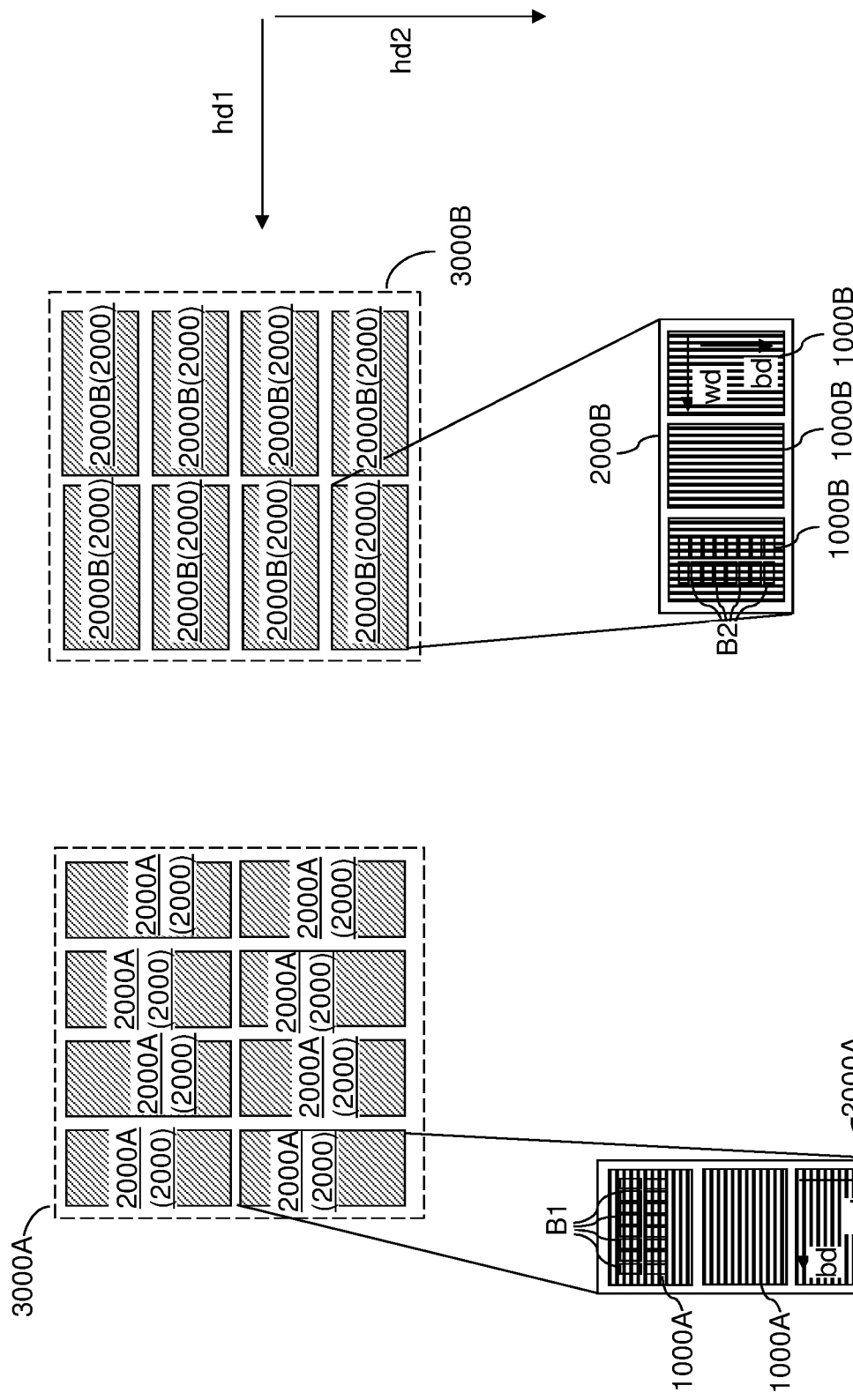
FIG. 5B illustrates a schematic view of a layout of planes within memory dies according to the third embodiment of the present disclosure.

Referring to FIGS. 4, 5A, and 5B, exposure field 3000 on a wafer may be divided into a first group including first exposure fields 3000A and a second group including second exposure fields 3000B. The total number of the first exposure fields 3000A may be about the same as the total number of the second exposure fields 3000B. For example, the total number of the first exposure fields 3000A may be in a range from 80% to 120% of the total number of the second exposure fields 3000B. Each lithographic exposure process may include a first step in which areas of the first exposure fields 3000A are exposed with a lithographic pattern while the wafer 4000 is oriented at a first rotational angle (such as zero degrees) with respect to the geometrical center of the wafer 4000 (such as the center of the circle including the circumference of the wafer 4000), and a second step in which the wafer 4000 is rotated to a second rotational angle (such as 90 degrees or 270 degrees) that is rotated from the first rotational angle by 90 degrees or 270 degrees relative to the first rotational angle and areas of the second exposure fields 3000B are exposed with the same lithographic pattern. FIG. 4 illustrates the wafer 4000 after performing the first step of a lithographic exposure process and prior to performing the second step of the lithographic exposure process. FIGS. 5A and 5B illustrate the wafer 4000 after performing the second step of the lithographic exposure process.

Each exposure field 3000 includes patterns for at least one semiconductor die 2000. The semiconductor dies 2000 that are formed within the first exposure fields 3000A are referred to as first semiconductor dies 2000A (which may be first memory dies), and the semiconductor dies 2000 that are formed within the second exposure fields 3000B are referred to as second semiconductor dies 2000B. Each first semiconductor die 2000A includes at least one first plane 1000A including first memory blocks B1, and each second semiconductor die 2000B includes at least one second plane 1000B including second memory blocks B2. Each first memory block B1 may include bit lines laterally extending along a first horizontal direction hd1 (which is the bit line direction "bd" in the first planes 1000A) and word lines laterally extending along a second horizontal direction hd2 (which is the word line direction "wd" in the first planes 1000A) that is perpendicular to the first horizontal direction hd1. Each second memory block B2 may include bit lines laterally extending along the second horizontal direction hd2 (which is the bit line direction "bd" in the second planes 1000B) and word lines laterally extending along the first horizontal direction hd1 (which is the word line direction "wd" in the second planes 1000B).

Generally, a set of reticles that include lithographic patterns for multiple exposure levels of at least one semiconductor die 2000 is provided. The at least one semiconductor die 2000 may include at least one memory die 2000. Memory dies 2000 may be formed on a wafer 4000 by performing a sequence of processing steps including deposition processes, etch processes, and lithographic patterning processes that employ the set of reticles. The memory dies 2000 are physical implementations of a design for the at least one semiconductor die 2000 as embodied in the set of reticles.

Each of the lithographic patterning steps may comprise a photoresist application step in which a photoresist layer is applied over the wafer 4000, a first lithographic exposure step in which the photoresist layer is lithographically exposed within a lithographic pattern in a respective reticle selected from the set of reticles in a plurality of first exposure fields 3000A over the wafer 4000 while the wafer 4000 is oriented at a first rotational angle with respect to orientations of the first exposure fields about an vertical axis passing through a geometrical center GCW of the wafer 4000, and a second lithographic exposure step in which the photoresist layer is lithographically exposed within the lithographic pattern in the respective reticle selected from the set of reticles in a plurality of second exposure fields 3000B over the wafer 4000 while the wafer 4000 is oriented at a second rotational angle with respect to orientations of the second exposure fields 3000B about the vertical axis passing through the geometrical center GWC of the wafer 4000. The second exposure fields 3000B are not lithographically exposed during the first lithographic exposure step, and the first exposure fields are not lithographically exposed during the second lithographic exposure step.

In one embodiment, the each of the lithographic patterning steps comprises a development step in which lithographic patterns transferred into the photoresist layer in the first lithographic exposure step and in the second lithographic exposure step are simultaneously developed within areas of the plurality of first exposure fields 3000A and within areas of the plurality of second exposure fields 3000B. In one embodiment, the second rotational angle and the first rotational angle are different from each other by 90 degrees or 270 degrees.

In one embodiment, each memory die 2000 comprises a respective set of memory blocks (B1 or B2), each of the memory blocks (B1 or B2) comprises a respective set of memory stack structures that vertically extend through a respective alternating stack of insulating layers and electrically conductive layers. Each memory stack structure within the sets of memory stack structures comprises a respective vertical semiconductor channel and a respective memory film.

In one embodiment, a total area of the plurality of first exposure fields 3000A may be in a range from 35% to 60% of a total area of the wafer, and a total area of the plurality of second exposure fields 3000B is in a range from 35% to 60% of the total area of the wafer 4000. The total area of the first exposure fields 3000A does not overlap with any of the total area of the second exposure fields 3000B. Each of the memory dies 2000 comprises a plurality of planes 1000. Each plane within the plurality of planes 1000 includes a respective plurality of memory blocks (B1 or B2).

FIGS. 6-19B illustrate an exemplary structure that may be used to implement a segment of each plane 1000. A first plurality of instances of the exemplary structure may be used in first planes 1000A such that the bit line direction bd within the first plurality of instances of the exemplary structure is the same as the first horizontal direction hd1 in FIGS. 1-5B, and the word line direction wd within the first plurality of instances of the exemplary structure is the same as the second horizontal direction hd2 in FIGS. 1-5B. A second plurality of instances of the exemplary structure may be used in second planes 1000B such that the bit line direction bd within the second plurality of instances of the exemplary structure is the same as the second horizontal direction hd2 in FIGS. 1-5B, and the word line direction wd within the second plurality of instances of the exemplary structure is the same as the first horizontal direction hd1 in FIGS. 1-5B. Multiple instances of the exemplary structure may be replicated within exposure fields 3000 described above to provide multiple planes 1000 having different bit line directions bd.

Referring to FIG. 6, an exemplary structure according to an embodiment of the present disclosure is illustrated, which may be used, for example, to fabricate a device structure containing vertical NAND memory devices. The exemplary structure includes a carrier substrate 9 and a semiconductor material layer 10 located on a top surface of the carrier substrate 9. In one embodiment, the carrier substrate 9 and the semiconductor material layer 10 may be provided as a commercially available single crystalline semiconductor wafer. A surface portion of the single crystalline semiconductor wafer may include the semiconductor material layer 10, and a bulk portion of the single crystalline semiconductor wafer may include the carrier substrate 9 that is subsequently removed, for example, by backside grinding. An interface 7 between the carrier substrate 9 and the semiconductor material layer 10 may be located at a depth that corresponds to a target stopping plane for the backside grinding process. Alternatively, the semiconductor material layer 10 may include a single crystalline or polycrystalline semiconductor material layer provided on the carrier substrate 9 including a material different from the material of the semiconductor material layer 10. In this case, the carrier substrate 9 may include an insulating material (such as sapphire or silicon oxide), a conductive material, or a semiconductor material different from the material of the semiconductor material layer 10. The thickness of the carrier substrate 9 may be thick enough to mechanically support the semiconductor material layer 10 and structures to be subsequently formed thereupon. For example, the carrier substrate 9 may have a thickness in a range from 60 microns to 1,000 microns. The thickness of the semiconductor material layer 10 may be in a range from 100 nm to 5,000 nm, although lesser and greater thicknesses may also be used. The semiconductor material layer 10 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 7:
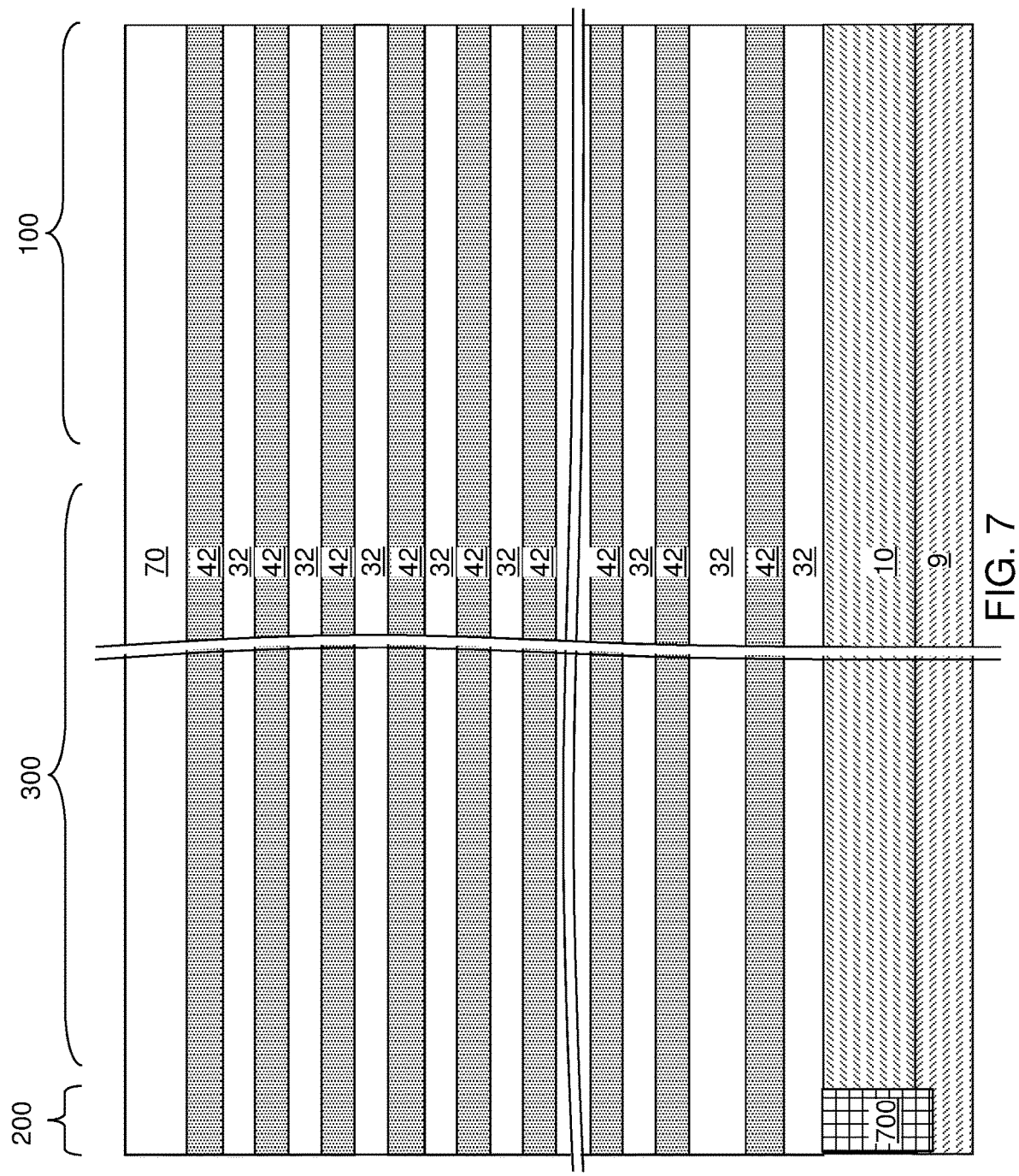
FIG. 7 is a schematic vertical cross-sectional view of the exemplary structure after formation of an alternating stack of insulating layers and sacrificial material layers according to an embodiment of the present disclosure.

Referring to FIG. 7, a stack of an alternating plurality of first material layers (which may be insulating layers 32) and second material layers (which may be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer 42. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 can be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the interface 7 between the carrier substrate 9 and the semiconductor material layer 10.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer 42 (e.g., a control gate electrode or a sacrificial material layer) may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

In alternative embodiments, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

The exemplary structure may include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 8:
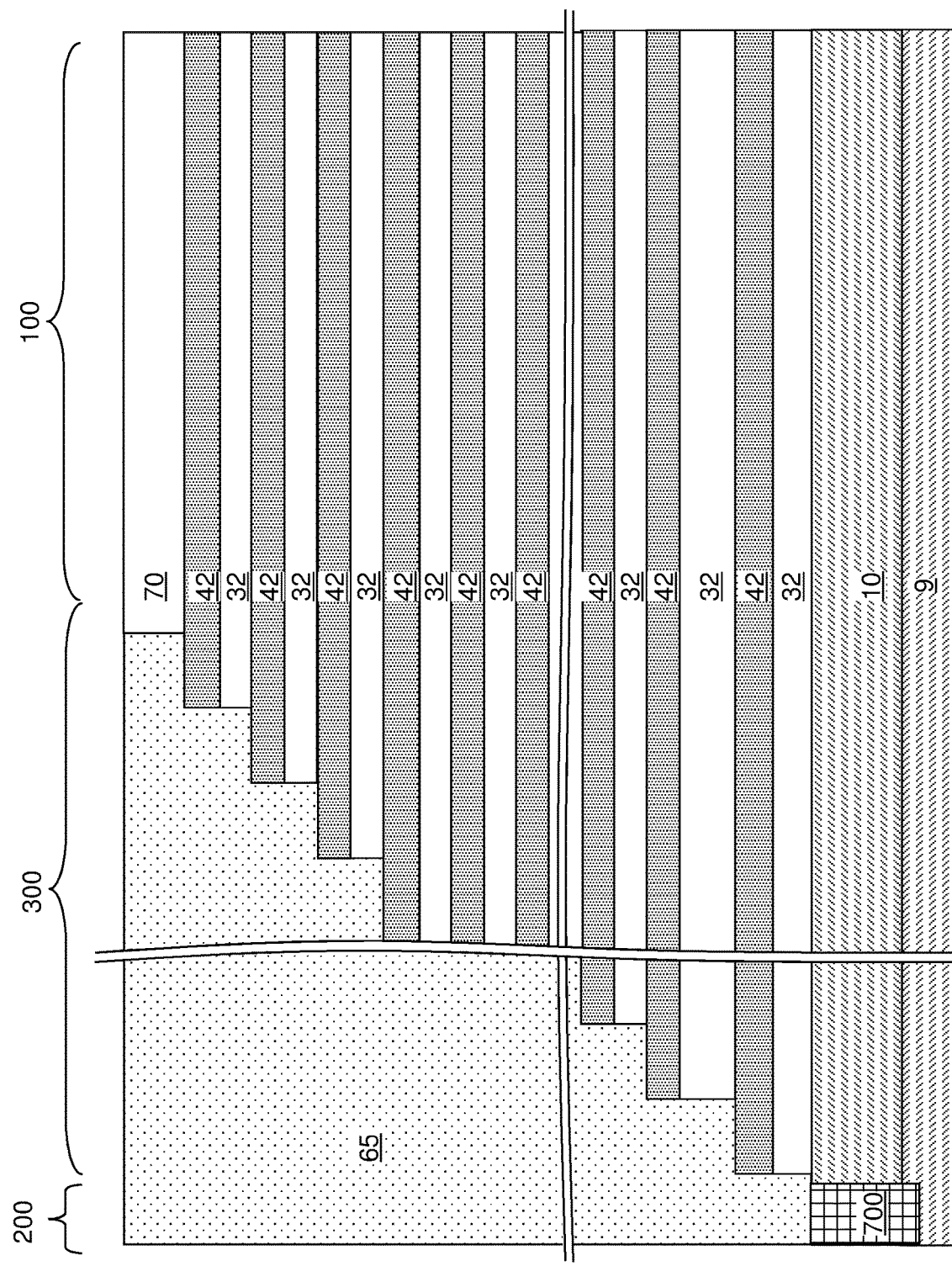
FIG. 8 is a schematic vertical cross-sectional view of the exemplary structure after formation of stepped terraces and a retro-stepped dielectric material portion according to an embodiment of the present disclosure.

Referring to FIG. 8, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity may have various stepped surfaces such that the horizontal cross-sectional shape of the stepped cavity changes in steps as a function of the vertical distance from the top surface of the semiconductor material layer 10. In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a word line direction wd such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In an illustrative example (not shown in FIG. 8), two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the word line direction wd, and the columns of staircases may be arranged along a bit line direction bd that is perpendicular to the word line direction wd. In one embodiment, the word line direction wd may be perpendicular to the boundary between the memory array region 100 and the staircase region 300.

A stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 9A:
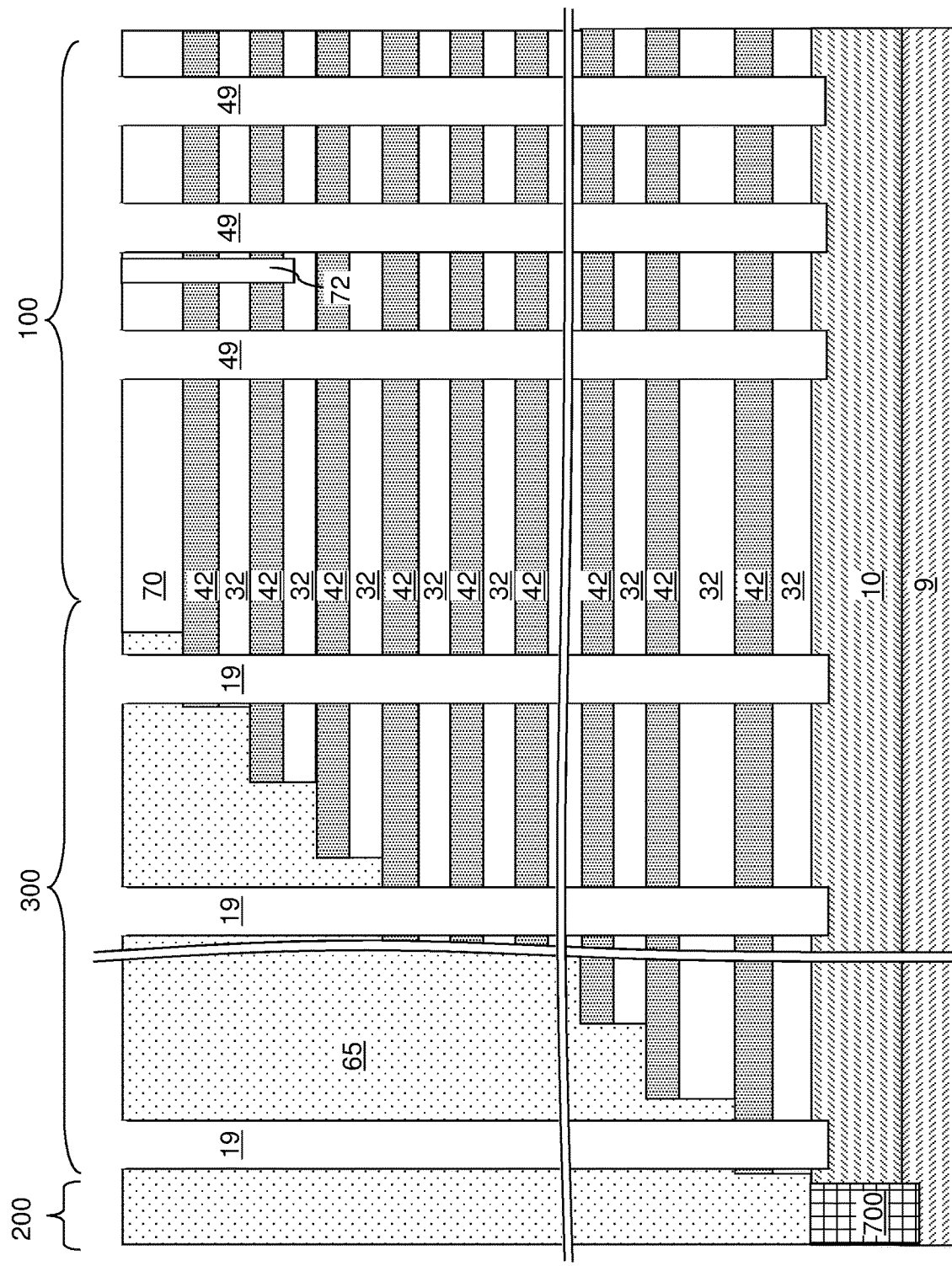
FIG. 9A is a schematic vertical cross-sectional view of the exemplary structure after formation of memory openings and support openings according to an embodiment of the present disclosure.
Figure 9B:
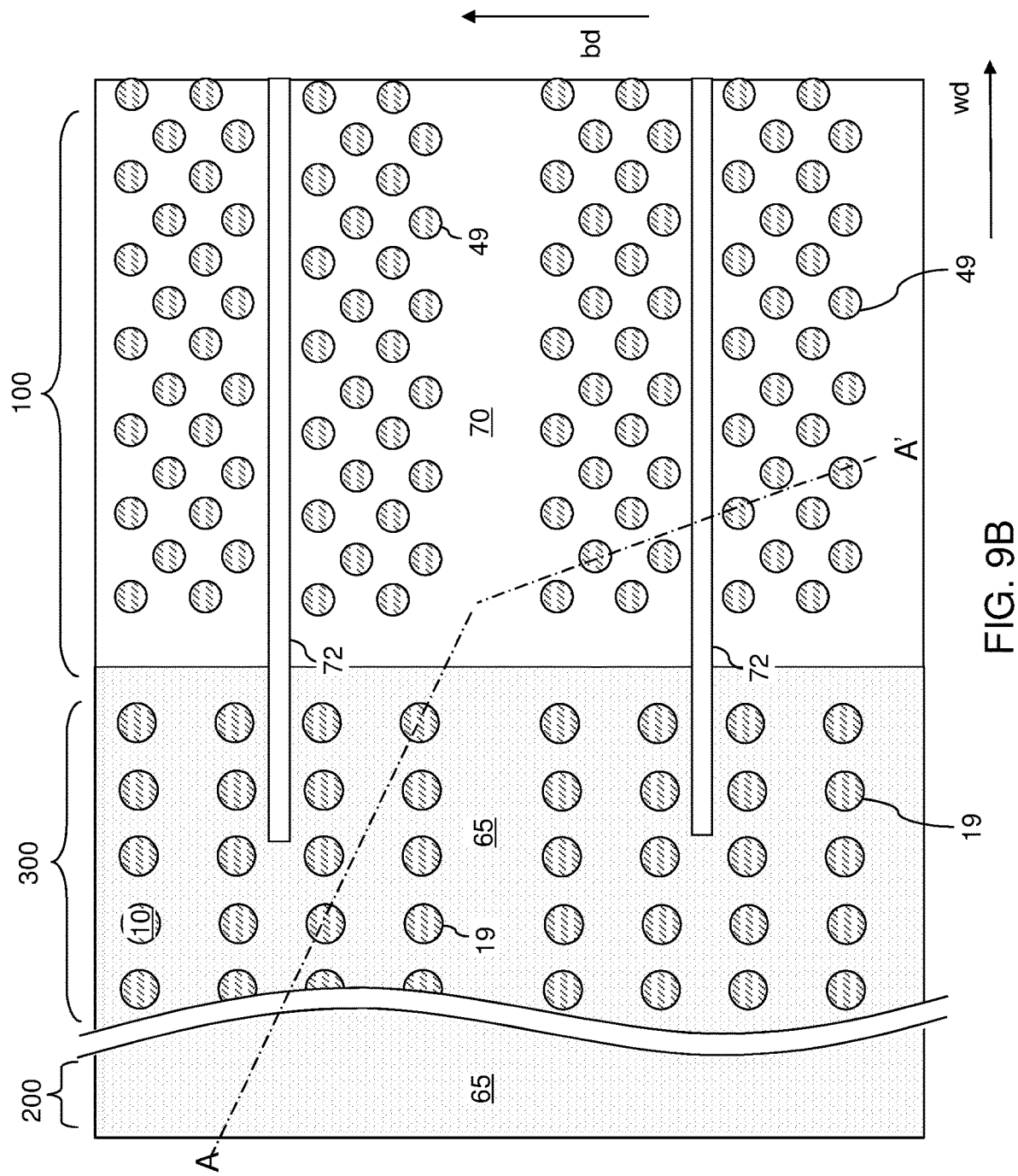
FIG. 9B is a top-down view of the exemplary structure of FIG. 9A. The vertical plane A-A' is the plane of the cross-section for FIG. 9A.

Referring to FIGS. 9A and 9B, a lithographic material stack (not shown) including at least a photoresist layer may be formed over the insulating cap layer 70 and the stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100.

A two-dimensional array of support openings 19 may be formed in the staircase region 300.

FIGS. 10A-10H illustrate structural changes in a memory opening 49, which is one of the memory openings 49 in the exemplary structure of FIGS. 9A and 9B. The same structural change occurs simultaneously in each of the other memory openings 49 and in each support opening 19.

Referring to FIG. 10A, a memory opening 49 in the exemplary device structure of FIGS. 10A and 10B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Alternatively, the sacrificial material layers 42 may be laterally recessed partially to form lateral recesses (not shown), for example, by an isotropic etch.

Referring to FIG. 10B, an optional pedestal channel portion (e.g., an epitaxial pedestal) 11 may be formed at the bottom portion of each memory opening 49. While FIG. 10B illustrates the pedestal channel portion 11 formed in the bottom portion of a memory opening 49, such pedestal channel portion 11 may be formed in the bottom portion of support opening 19. In either case, the pedestal channel portion 11 may be formed, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the carrier substrate, semiconductor material layer (9, 10) (collectively "substrate") and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the carrier substrate 9, which may have a doping of the first conductivity type.

Referring to FIG. 10C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may also be used to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 10D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process employing a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in embodiments where pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 10E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. Alternatively, the first semiconductor channel layer 601 may be optionally removed before depositing the second semiconductor channel layer 602. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 10F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 10G, the horizontal portion of the dielectric core layer 62L may be removed, for example, by a recess etch or CMP from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may employ a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 10H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20 (not shown in FIG. 10H).

Figure 11:
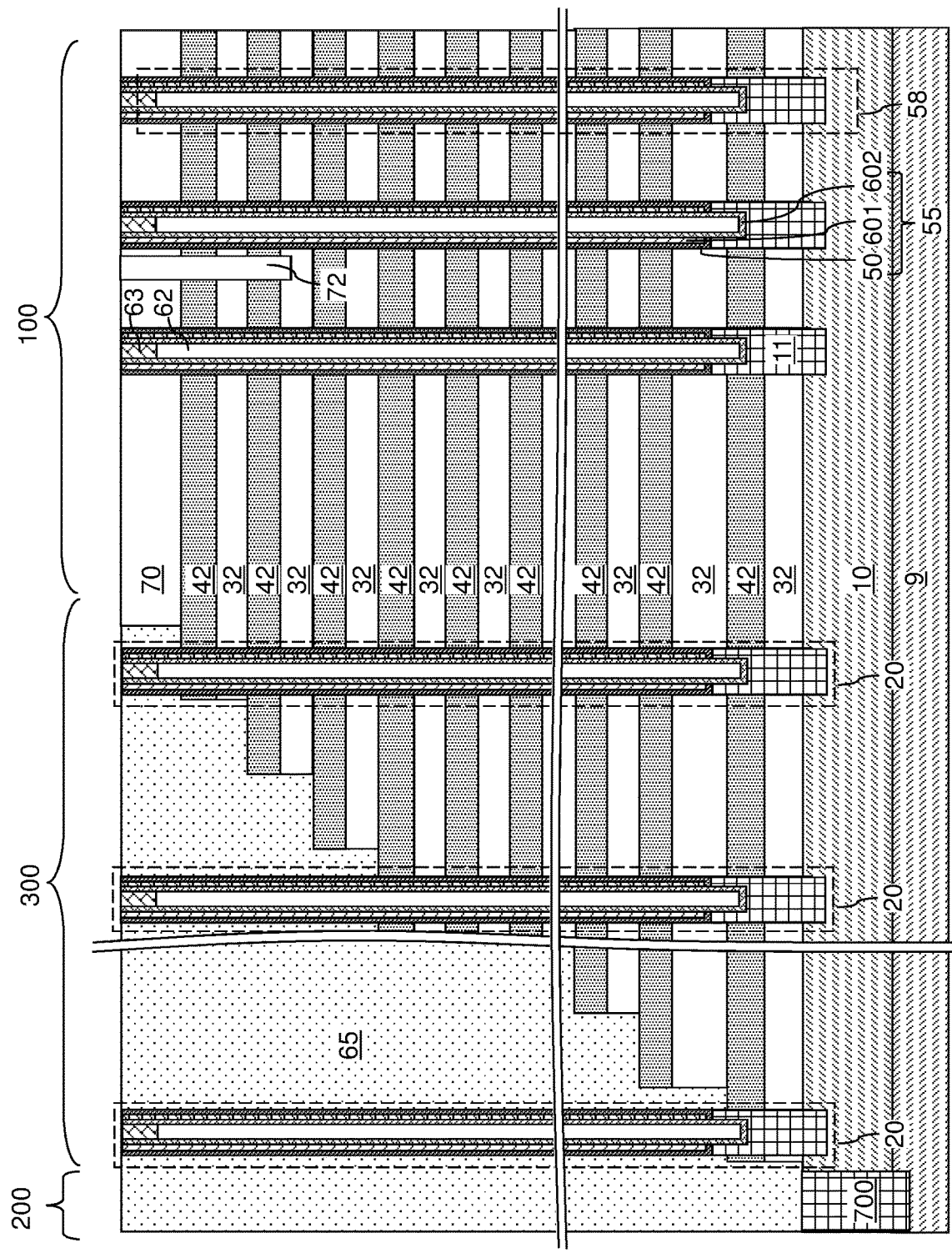
FIG. 11 is a schematic vertical cross-sectional view of the exemplary structure after formation of memory stack structures and support pillar structures according to an embodiment of the present disclosure.

Referring to FIG. 11, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 9A and 9B. An instance of the support pillar structure 20 may be formed within each support opening 19 of the structure of FIGS. 9A and 9B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described employing the illustrated configuration for the memory stack structure, the methods of the present disclosure may be applied to alternative memory stack structures including different layer stacks or structures for the memory film 50 and/or for the vertical semiconductor channel 60.

Figure 12A:
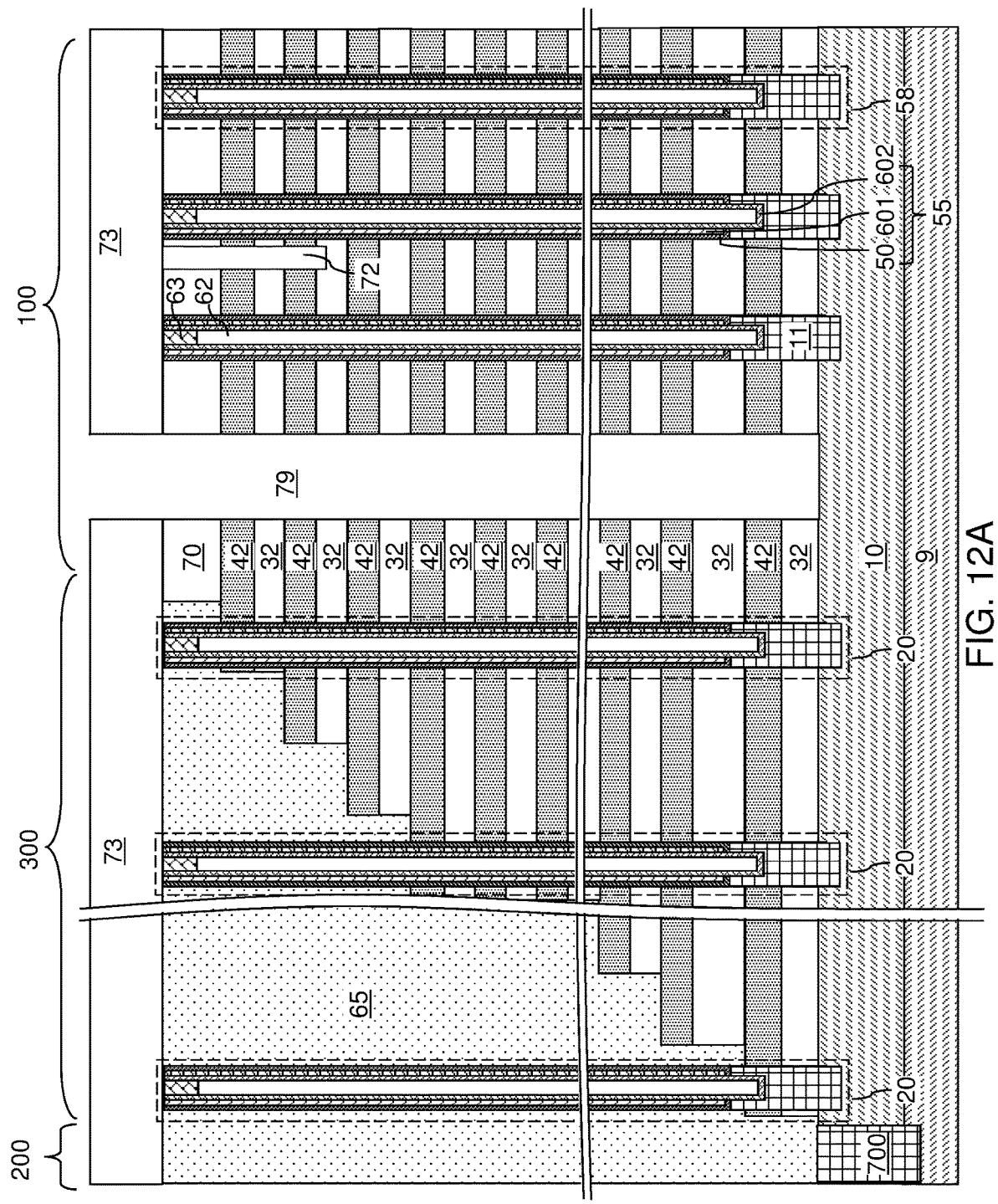
FIG. 12A is a schematic vertical cross-sectional view of the exemplary structure after formation of backside trenches according to an embodiment of the present disclosure.
Figure 12B:
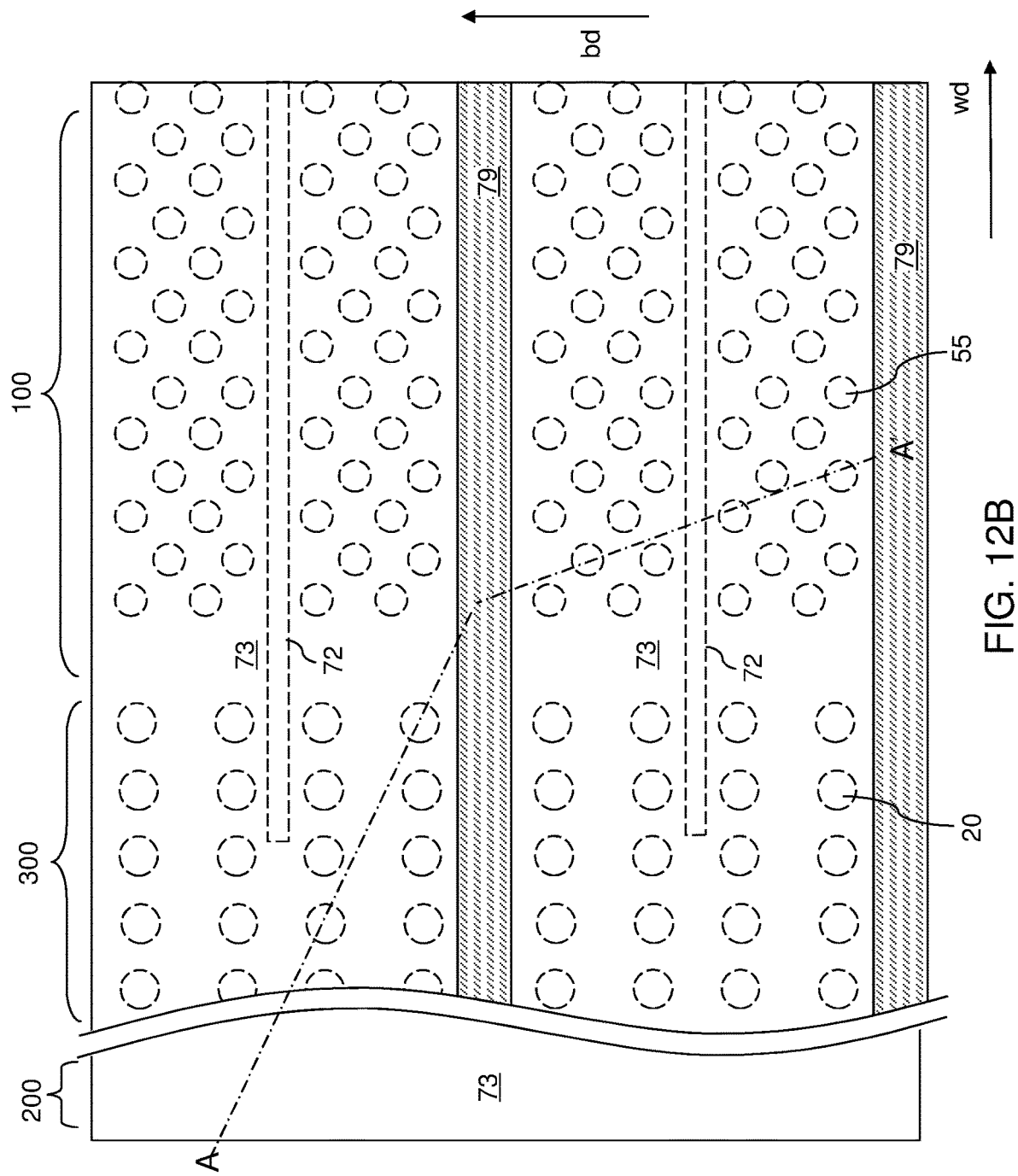
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the stepped dielectric material portion 65 employing an anisotropic etch to form backside trenches 79, which vertically extend from the top surface of the contact level dielectric layer 73 at least to the top surface of the substrate semiconductor material layer 10, and laterally extend through the memory array region 100 and the staircase region 300.

In one embodiment, the backside trenches 79 may laterally extend along a word line direction wd and may be laterally spaced apart with respect to one another along a bit line direction bd that is perpendicular to the word line direction wd. The memory stack structures 55 may be arranged in rows that extend along the word line direction wd. The drain select level isolation structures 72 may laterally extend along the word line direction wd. Each backside trench 79 may have a uniform width that is invariant along the lengthwise direction (i.e., along the word line direction wd). Each drain select level isolation structure 72 may have a uniform vertical cross-sectional profile along vertical planes that are perpendicular to the word line direction wd that is invariant with translation along the word line direction wd. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 13:
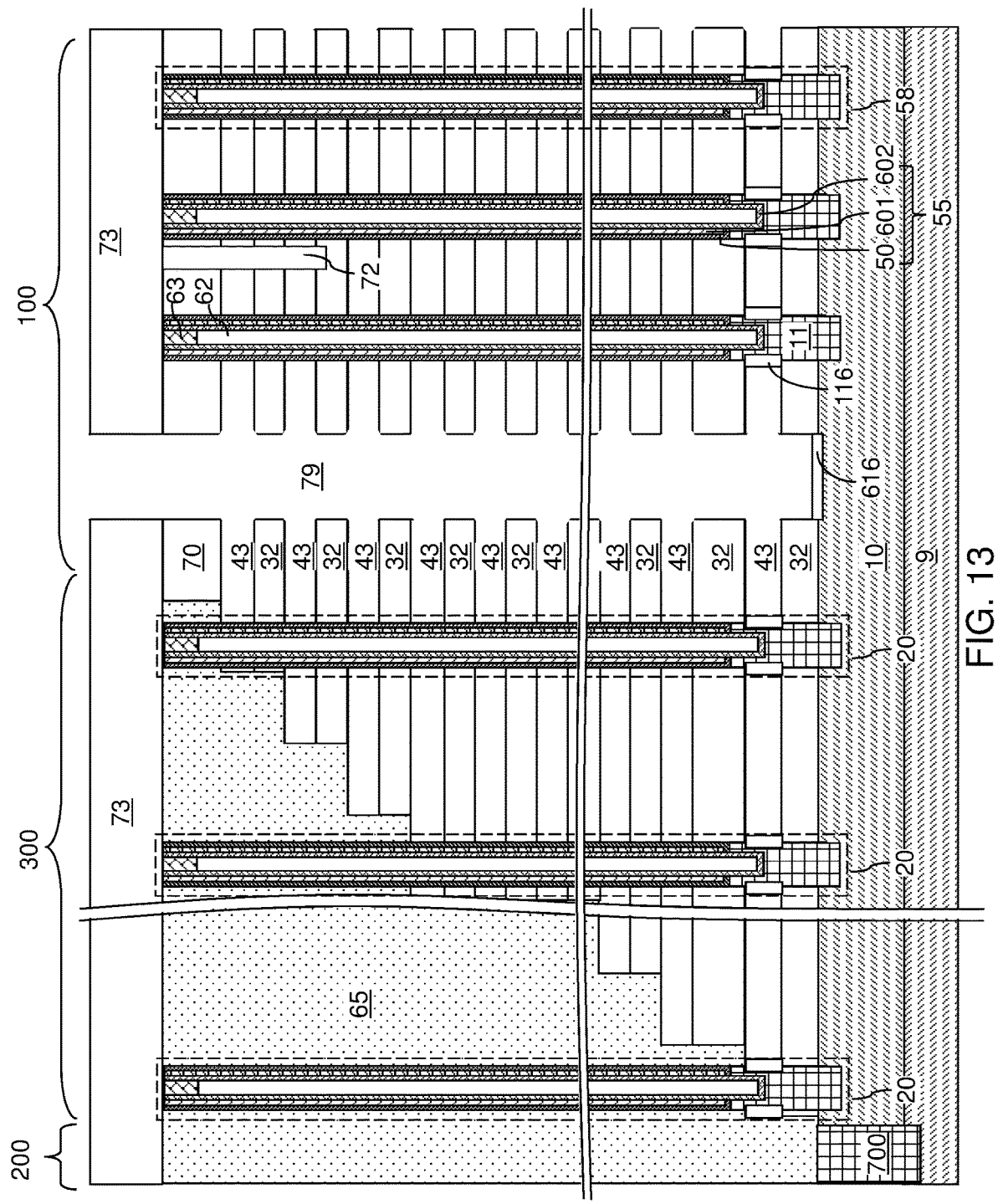
FIG. 13 is a schematic vertical cross-sectional view of the exemplary structure after formation of backside recesses according to an embodiment of the present disclosure.

Referring to FIGS. 13 and 14A, an etchant that selectively etches the second material of the sacrificial material layers 42 with respect to the first material of the insulating layers 32 may be introduced into the backside trenches 79, for example, employing an etch process. FIG. 14A illustrates a region of the exemplary structure of FIG. 13. Backside recesses 43 are formed in volumes from which the sacrificial material layers 42 are removed. The removal of the second material of the sacrificial material layers 42 may be selective to the first material of the insulating layers 32, the contact level dielectric layer 73, the insulating cap layer 70, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 14B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 14C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 15:
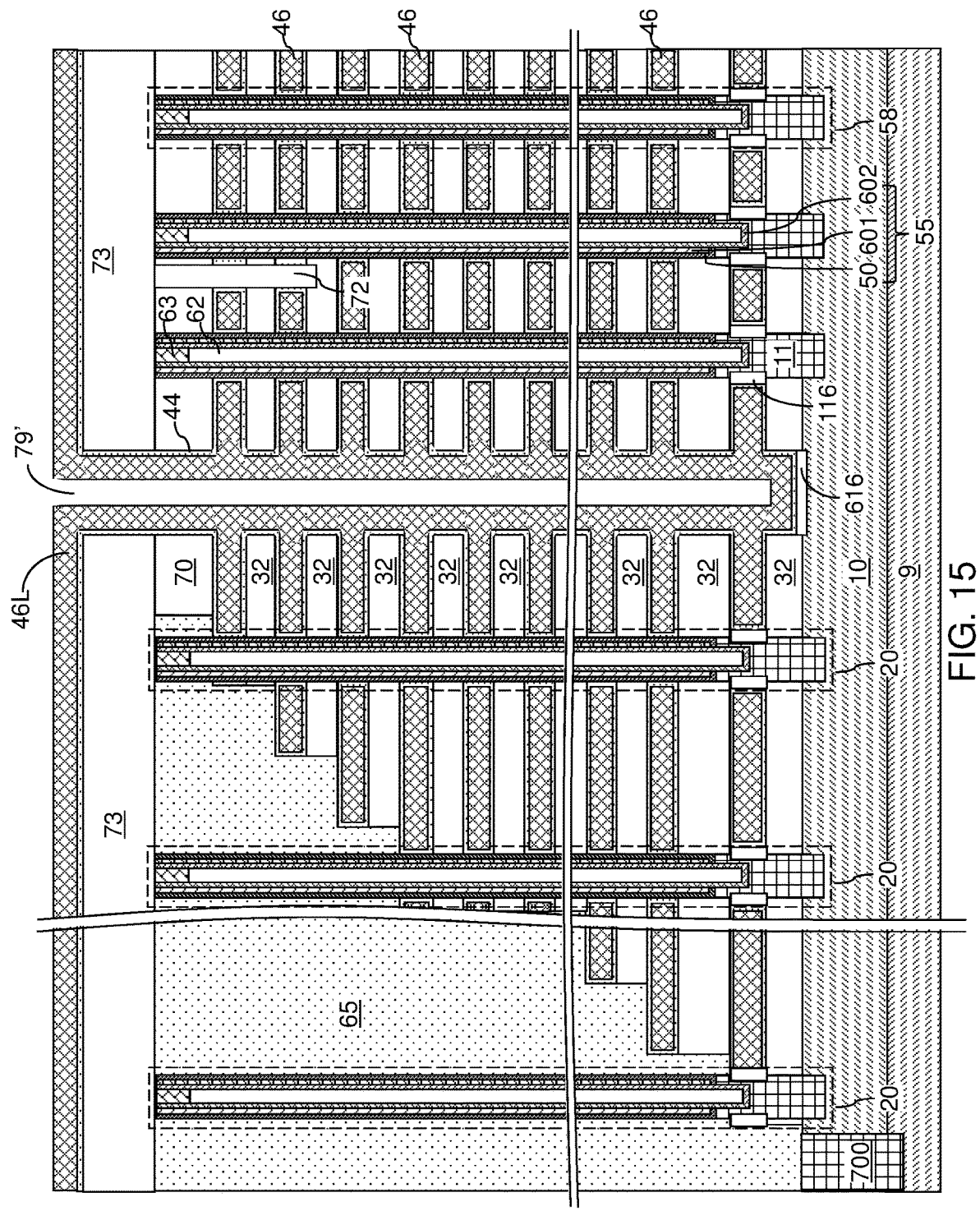
FIG. 15 is a schematic vertical cross-sectional view of the exemplary structure at the processing step of FIG. 14D.

Referring to FIGS. 14D and 15, a metal fill material is deposited in the plurality of backside recesses 43, on the sidewalls of the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited employing a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous metallic material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 16A:
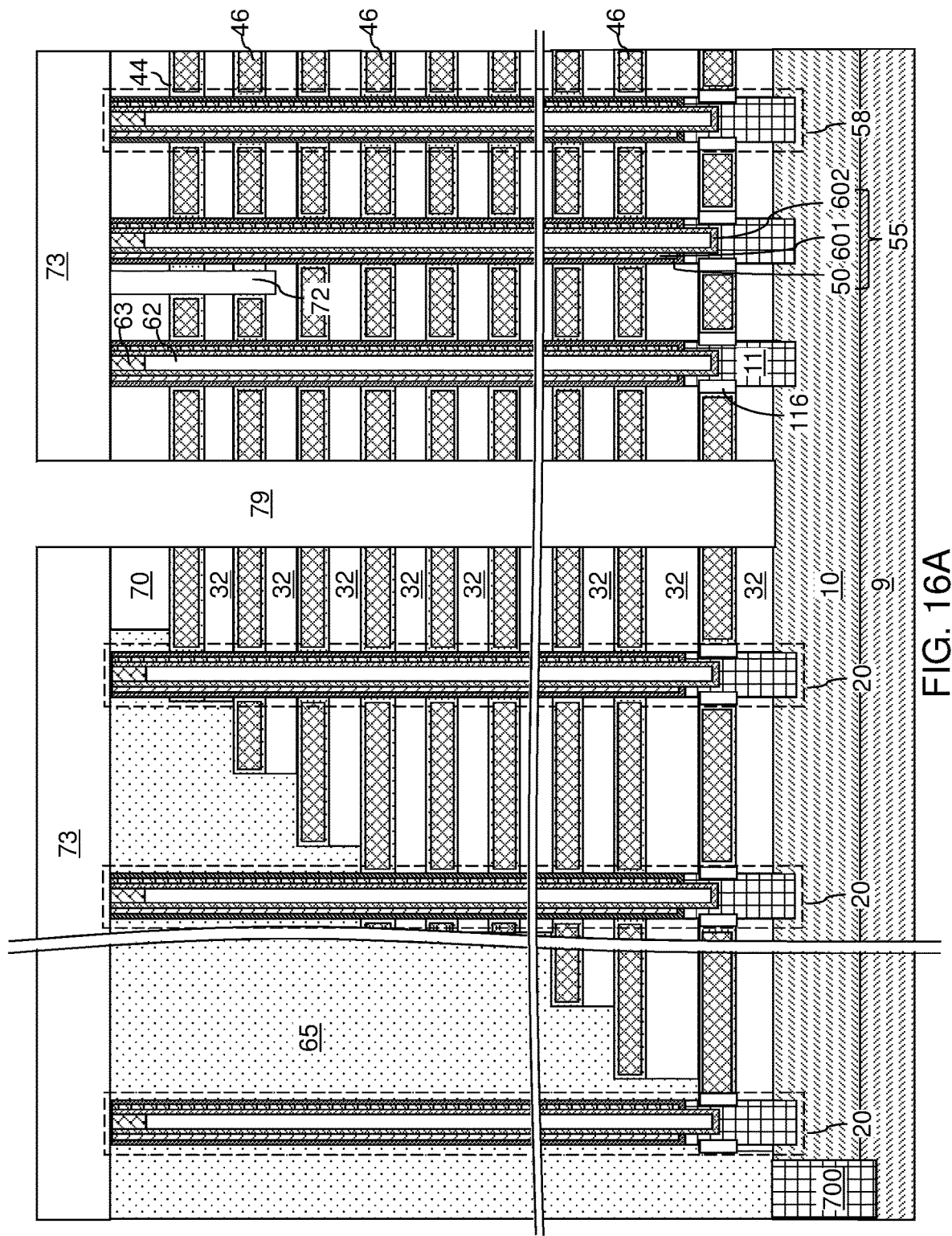
FIG. 16A is a schematic vertical cross-sectional view of the exemplary structure after removal of a deposited conductive material from within the backside trench according to an embodiment of the present disclosure.
Figure 16B:
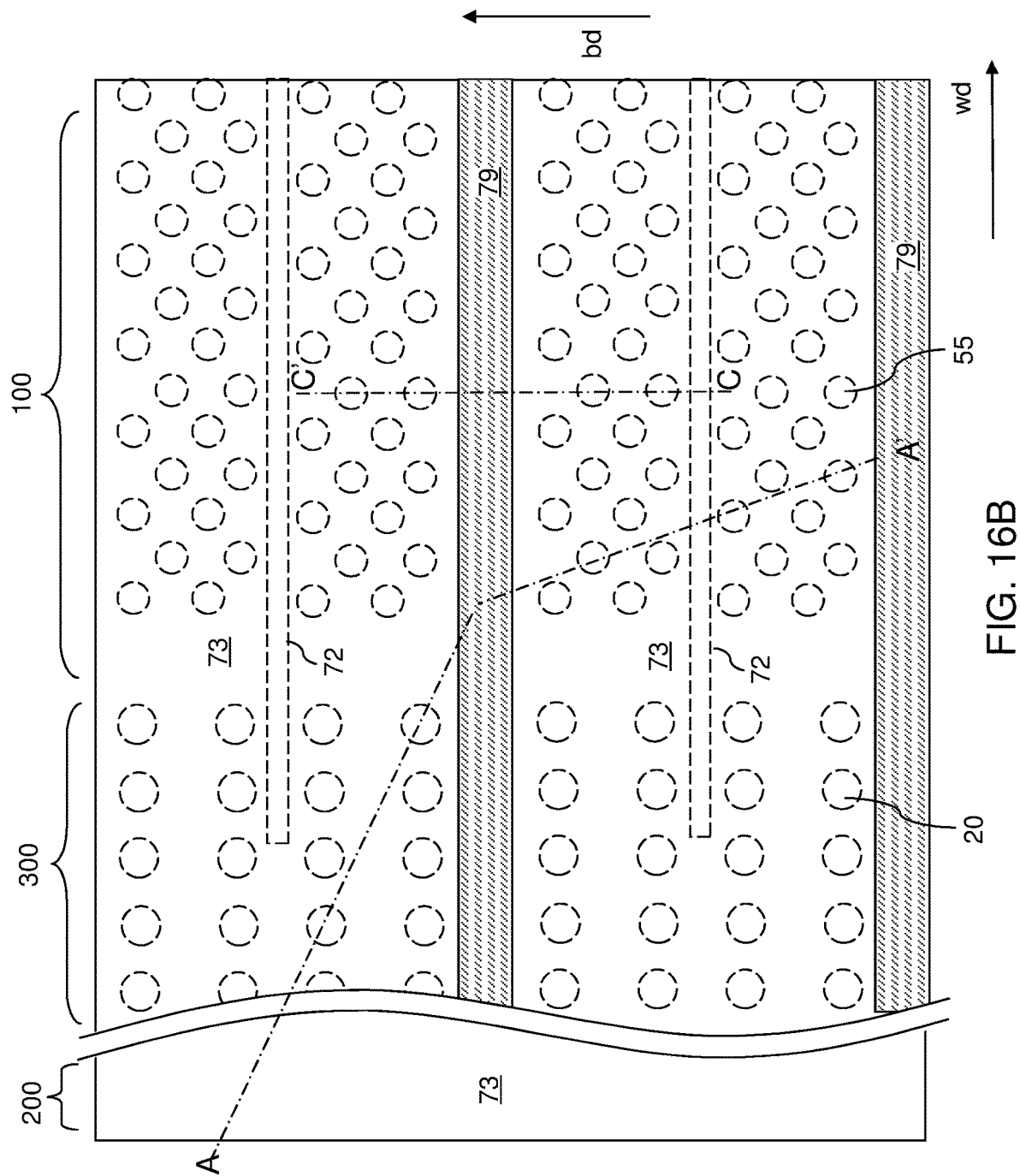
FIG. 16B is a partial see-through top-down view of the exemplary structure of FIG. 16A. The vertical plane A-A' is the plane of the schematic vertical cross-sectional view of FIG. 16A.
Figure 16C:
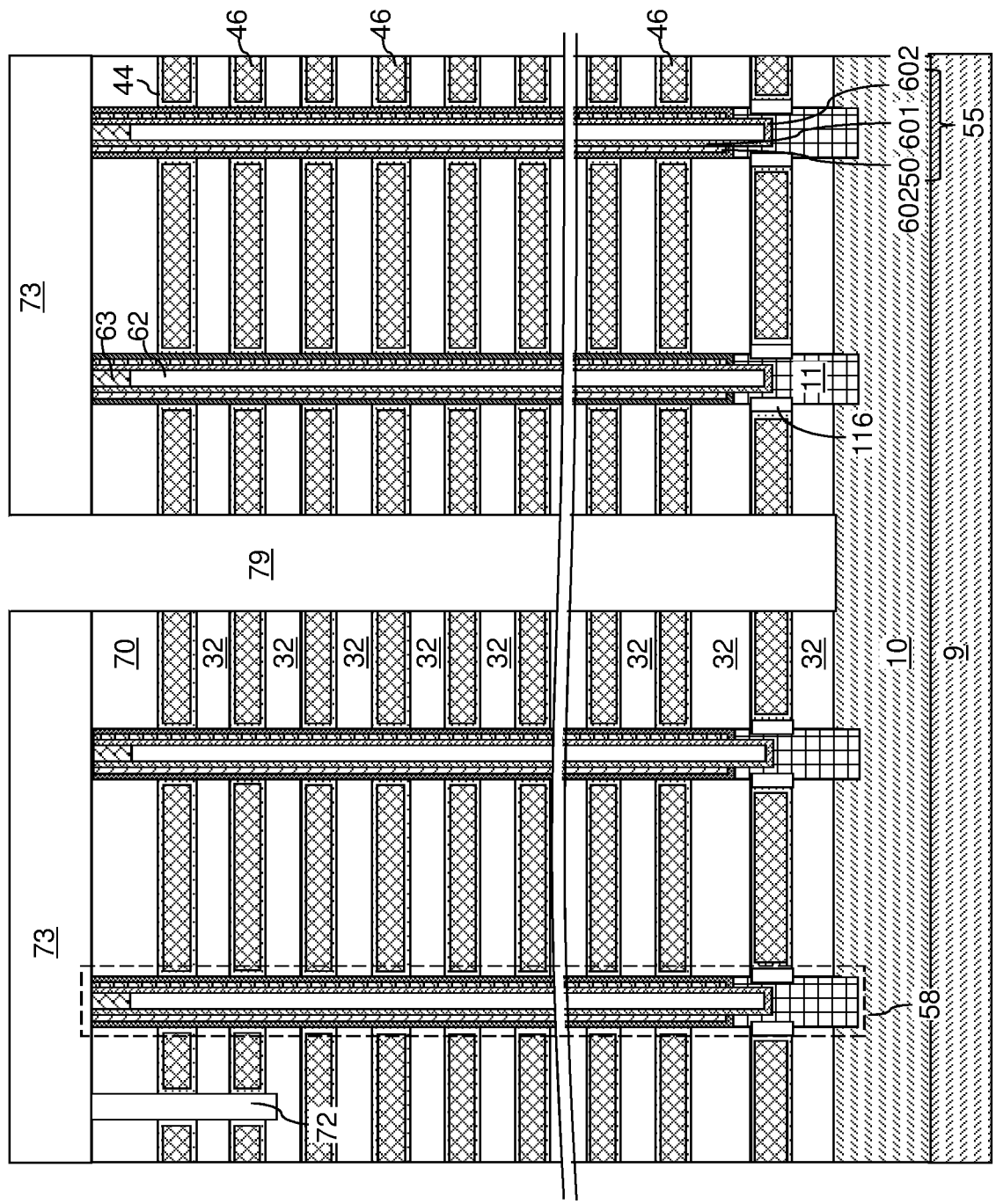
FIG. 16C is a vertical cross-sectional view of the exemplary structure along the vertical plane C-C' of FIG. 16B.

Referring to FIGS. 16A-16C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used.

Figure 17A:
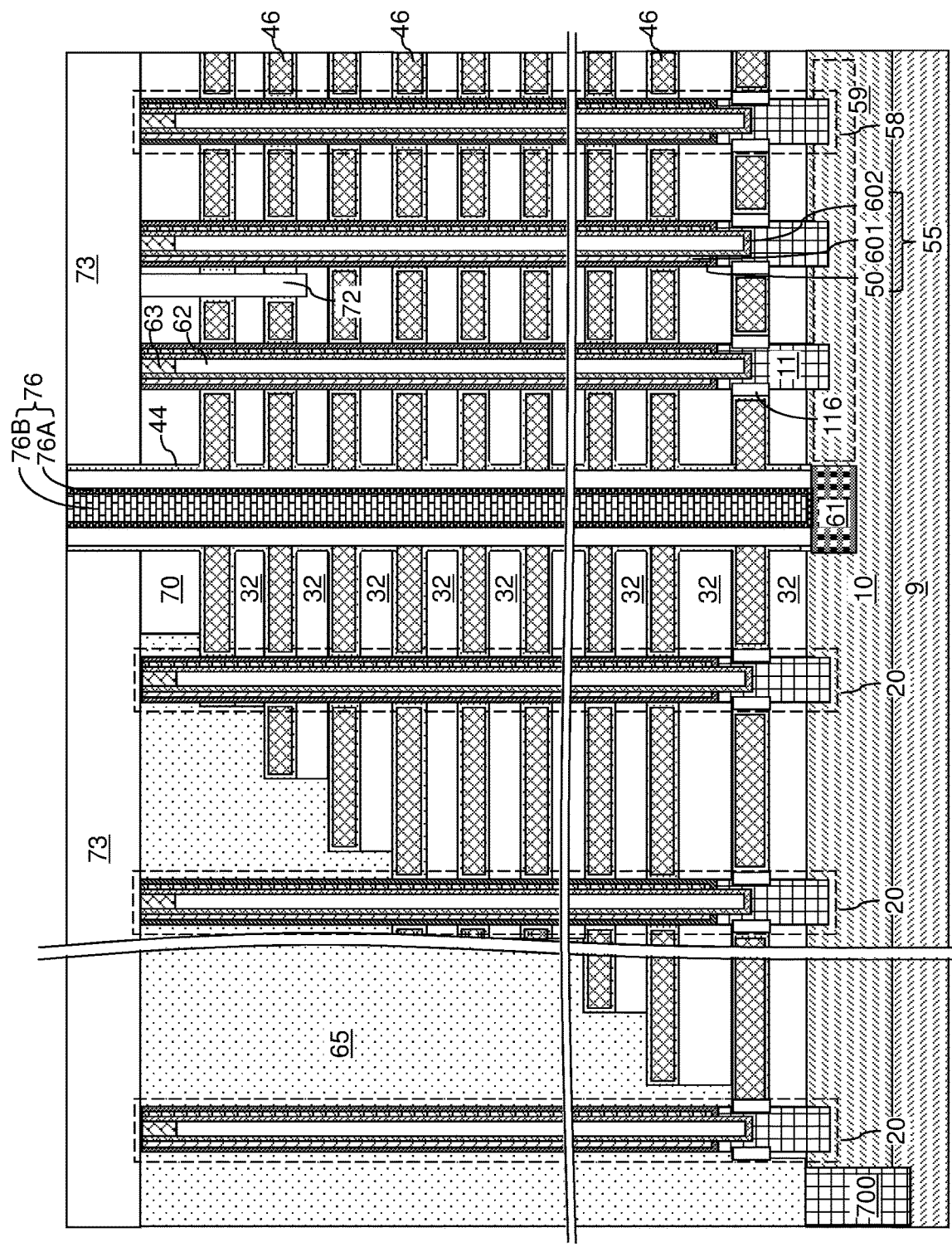
FIG. 17A is a schematic vertical cross-sectional view of the exemplary structure after formation of an insulating spacer and a backside contact structure according to an embodiment of the present disclosure.
Figure 17B:
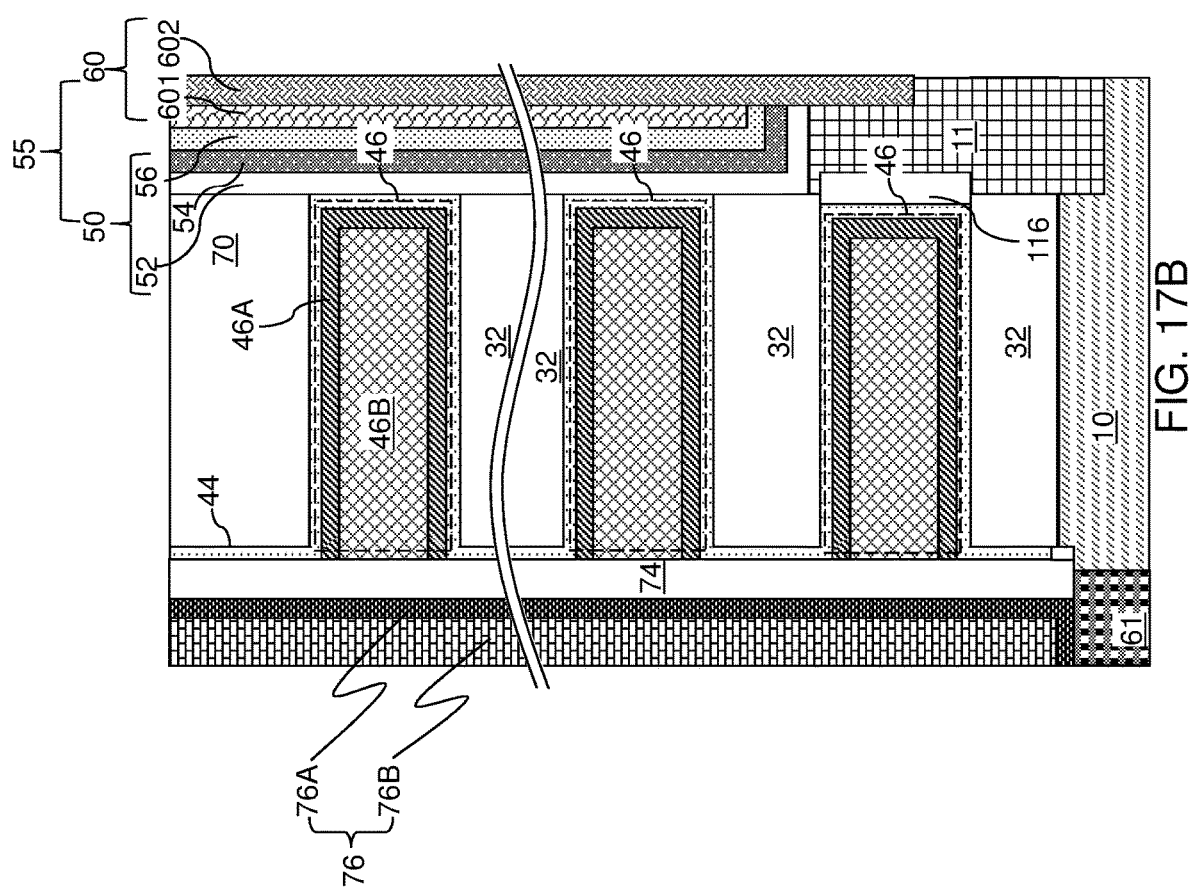
FIG. 17B is a magnified view of a region of the exemplary structure of FIG. 17A.

Referring to FIGS. 17A and 17B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 18A:
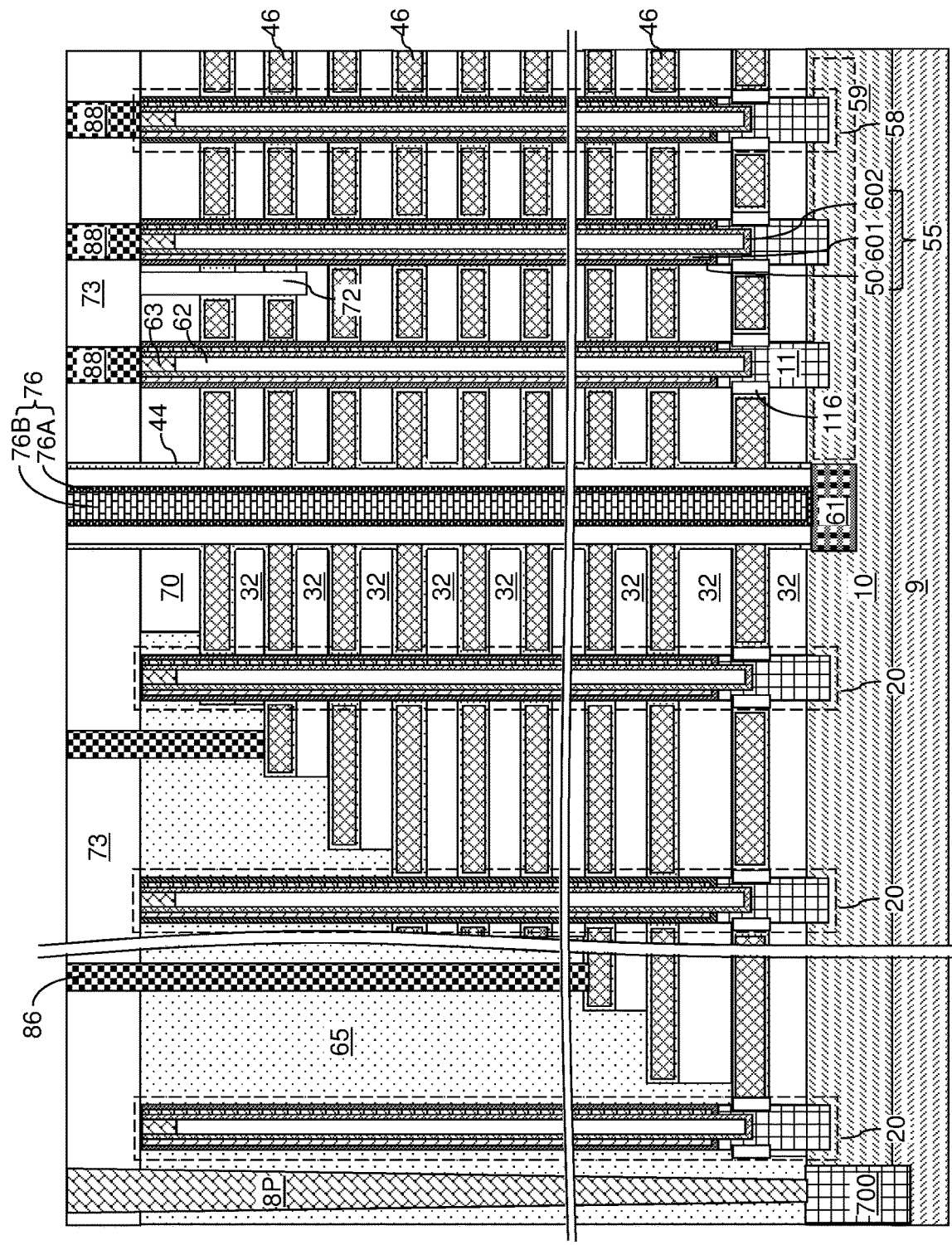
FIG. 18A is a schematic vertical cross-sectional view of the exemplary structure after formation of additional contact via structures according to an embodiment of the present disclosure.
Figure 18B:
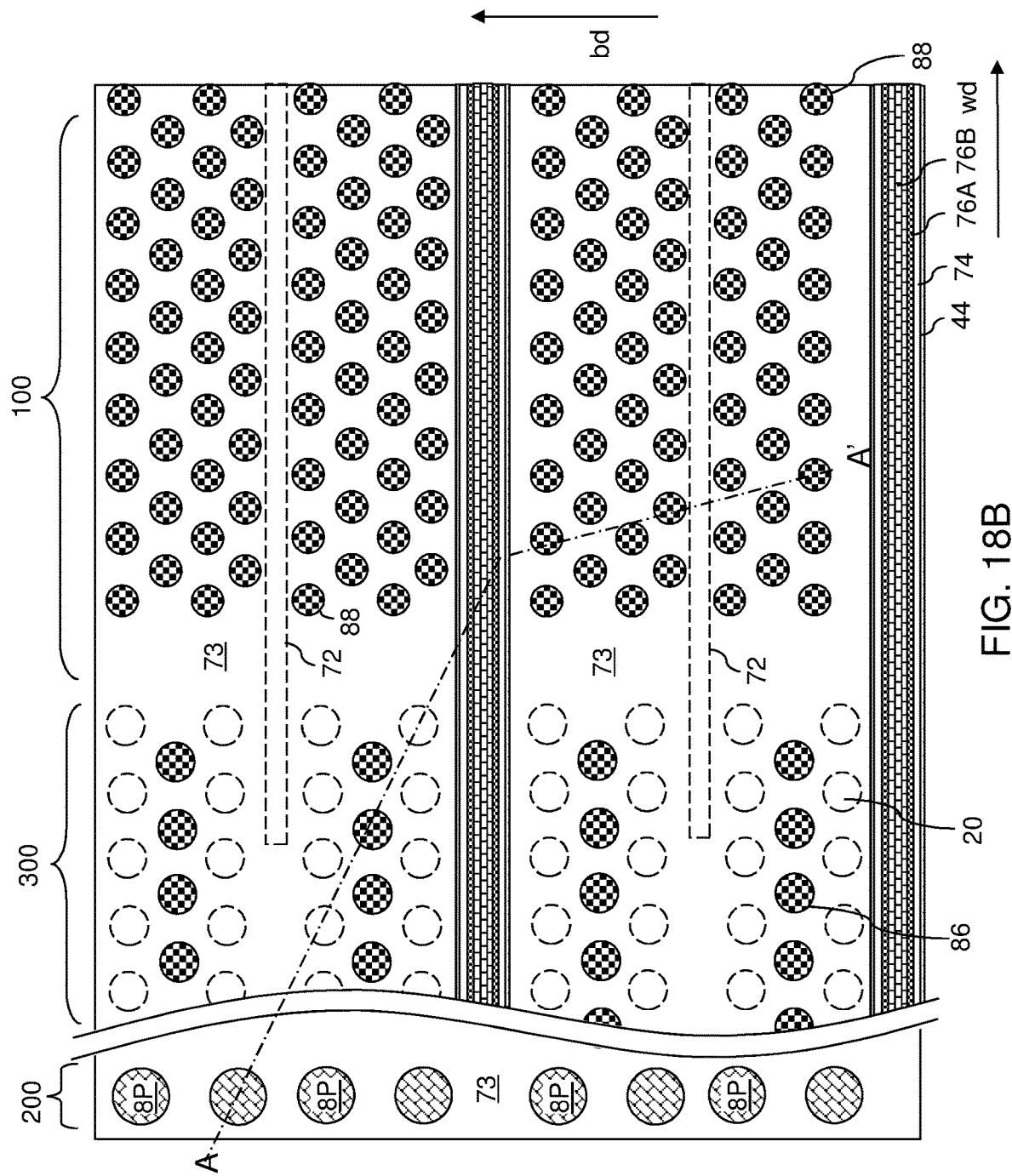
FIG. 18B is a top-down view of the exemplary structure of FIG. 18A. The vertical plane A-A' is the plane of the schematic vertical cross-sectional view of FIG. 19A.

Referring to FIGS. 18A and 18B, additional contact via structures (88, 86, 8P) may be formed through the contact level dielectric layer 73, and optionally through the stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the stepped dielectric material portion 65. Pass-through via structures 8P may be formed through the stepped dielectric material portion 65 to the semiconductor material layer 10.

Figure 19A:
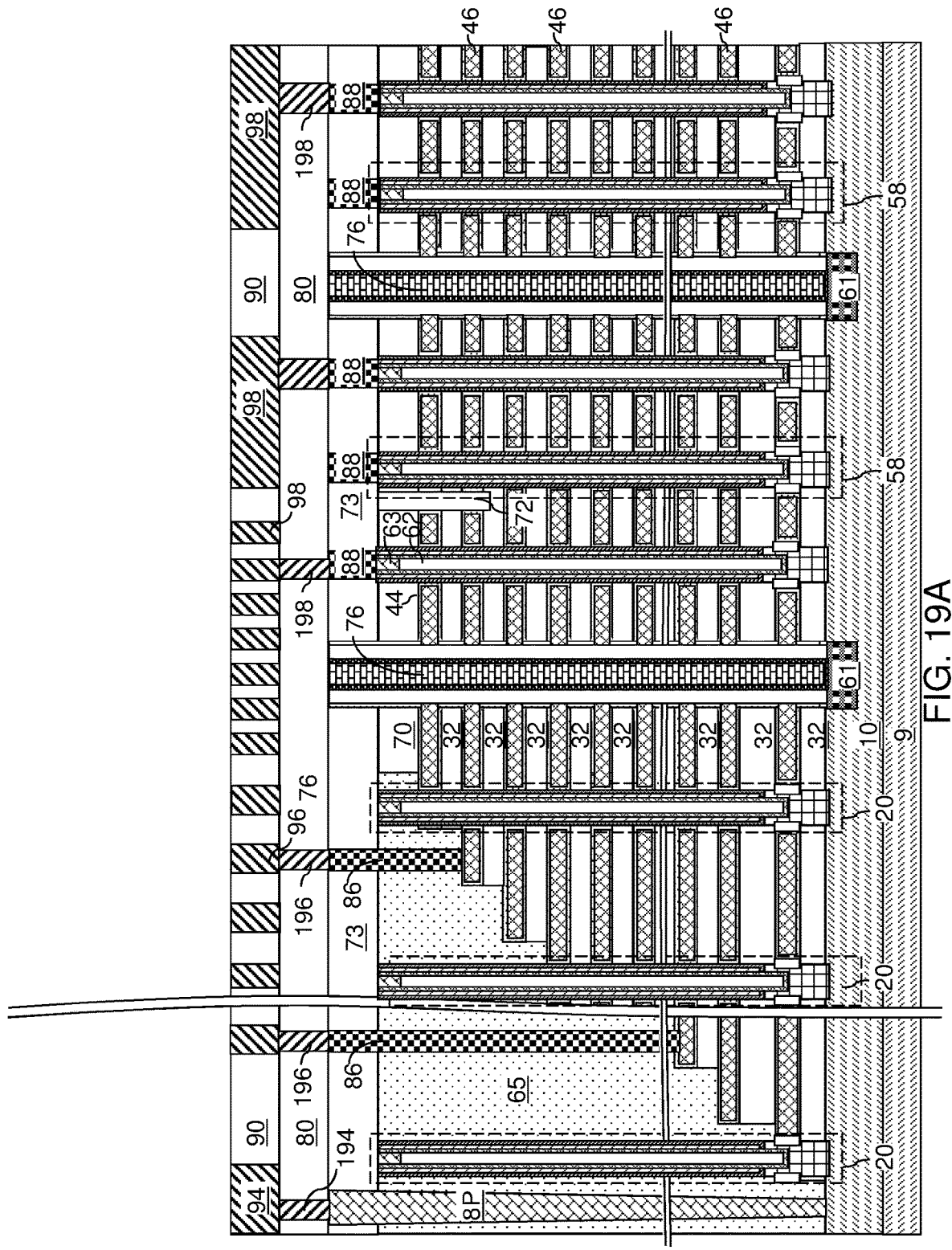
FIG. 19A is a schematic vertical cross-sectional view of the exemplary structure after formation of bit lines and additional metal interconnect structures according to an embodiment of the present disclosure.
Figure 19B:
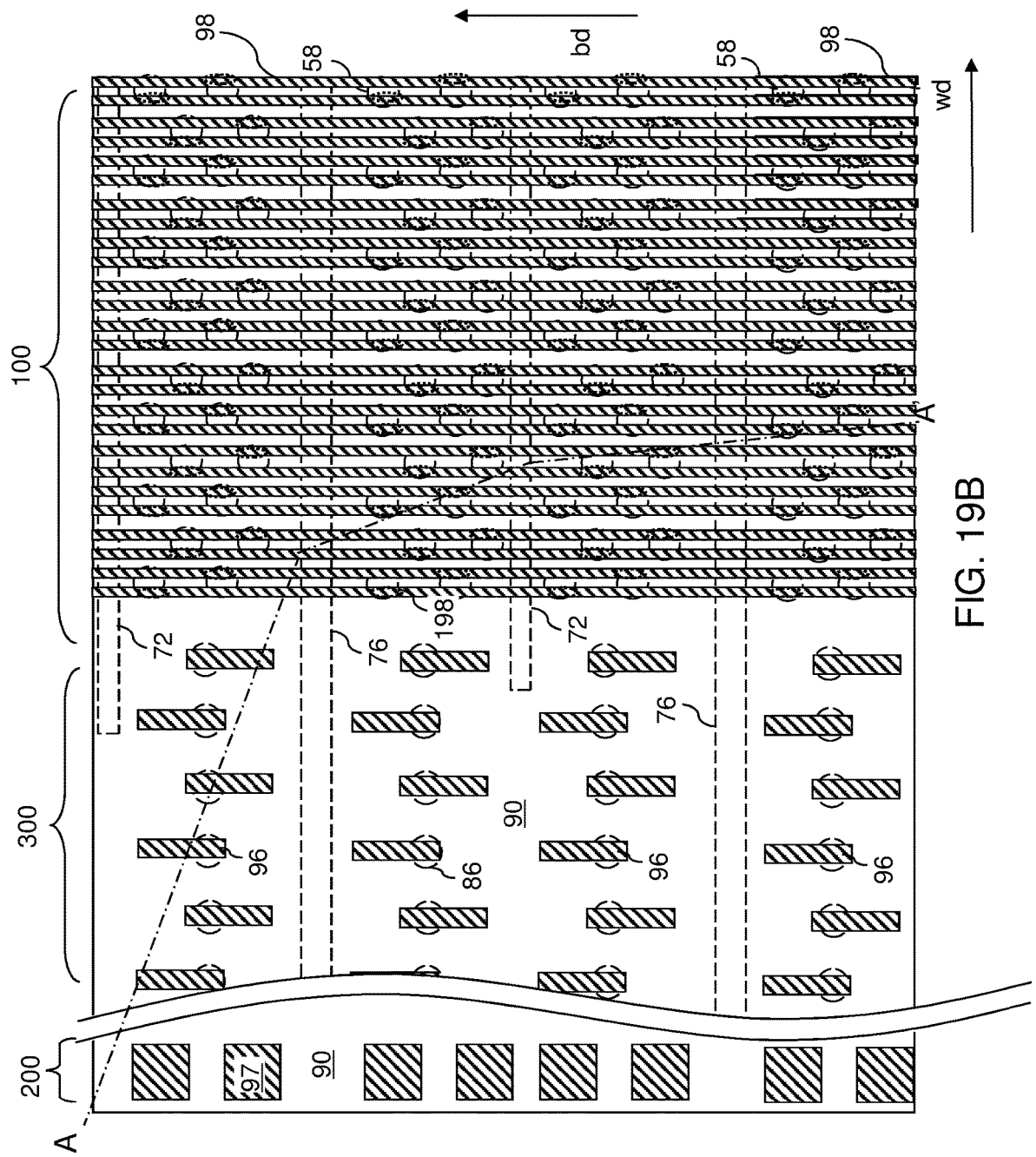
FIG. 19B is a top-down view of the exemplary structure of FIG. 19A. The vertical plane A-A' is the plane of the schematic vertical cross-sectional view of FIG. 19A.

Referring to FIGS. 19A and 19B, a via level dielectric layer 80 is formed over the contact level dielectric layer 73. Various connection via structures (198, 196, 194) may be formed through the via level dielectric layer 80. For example, bit line connection via structures 198 may be formed on the drain contact via structures 88, word line connection via structures 196 may be formed on the word line contact via structures 86, and peripheral extension via structures 194 may be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 96 that are electrically connected to a respective one of the word line contact via structures 86 (for example, through a word line connection via structure 196), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the word line direction wd, and the bit lines 98 laterally extend along the bit line direction bd.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings may be located over another memory cell (as embodied as another portion of the charge storage layer 54 at a level of another electrically conductive layer 46) in a second device level of the array of monolithic three-dimensional NAND strings. The silicon substrate may contain an integrated circuit comprising a driver circuit (as embodied as a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element may be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory die comprising:
   a first plane including a plurality of first memory blocks; and
   a second plane including a plurality of second memory blocks,
   wherein:
   each memory block respectively selected from the plurality of first memory blocks and the plurality of second memory blocks includes a respective set of memory stack structures that vertically extend through a respective alternating stack of insulating layers and electrically conductive layers, wherein each memory stack structure within the sets of memory stack structures comprises a respective vertical semiconductor channel and a respective memory film;
   each of the first plane includes a respective set of first bit lines that laterally extend along a first horizontal direction and electrically connected to a respective subset of vertical semiconductor channels; and
   each of the second plane includes a respective set of second bit lines that are parallel with respect to one another and laterally extend along a second horizontal direction that is perpendicular to the first horizontal direction and electrically connected to a respective subset of vertical semiconductor channels within the second plane.

2. The memory die of claim 1, wherein:
   electrically conductive layers within the first plane comprise word lines for a respective one of the first memory blocks and laterally extend along the second horizontal direction; and
   electrically conductive layers within the second plane comprise word lines for a respective one of the second memory blocks and laterally extend along the first horizontal direction.

3. The memory die of claim 2, wherein:
   first memory blocks within each first plane are laterally spaced apart with respect to one another by first trenches that laterally extend along the second horizontal direction;
   second memory blocks within each second plane are laterally spaced apart with respect to one another by second trenches that laterally extend along the first horizontal direction;
   each of the first bit lines extends over a respective plurality of first memory blocks; and
   each of the second bit lines extends over a respective plurality of second memory blocks.

4. The memory die of claim 1, wherein the semiconductor die comprises:
   a pair of first sidewalls that are parallel to the first horizontal direction;
   a pair of second sidewalls that are parallel to the second horizontal direction;
   a planar top surface adjoined to an upper edge of each of the pair of first sidewalls; and
   a planar bottom surface adjoined to a lower edge of each of the pair of second sidewalls.

5. The memory die of claim 1, wherein:
   the memory die includes a same total number of the first plane as a total number of the second plane; and memory stack structures within each of the second plane has a layout that is rotated from a layout of memory stack structures within one of the first plane by 90 degrees or 270 degrees.

* * * * *